United States Patent [19]
Shirai et al.

[11] Patent Number: 5,973,355
[45] Date of Patent: Oct. 26, 1999

[54] NONVOLATILE SEMICONDUCTOR MEMORY DEVICE AND MANUFACTURING METHOD OF THE SAME

[75] Inventors: Hiroki Shirai; Taishi Kubota; Ichiro Honma; Hirohito Watanabe; Haruhiko Ono; Takeshi Okazawa, all of Tokyo, Japan

[73] Assignee: NEC Corporation, Tokyo, Japan

[21] Appl. No.: 08/851,285

[22] Filed: May 5, 1997

[30] Foreign Application Priority Data

May 24, 1996 [JP] Japan .................................. 8-129625

[51] Int. Cl.⁶ .................................................. H01L 29/788
[52] U.S. Cl. ............................................ 257/317; 257/900
[58] Field of Search ...................................... 257/317, 900

[56] References Cited

U.S. PATENT DOCUMENTS 5,650,648  7/1997  Kapoor ..................................... 257/317

FOREIGN PATENT DOCUMENTS

| | | |
|---|---|---|
| A 1255278 | 10/1989 | Japan . |
| 2143464 | 6/1990 | Japan . |
| 4364075 | 12/1992 | Japan . |
| 5110107 | 4/1993 | Japan . |
| 677440 | 3/1994 | Japan . |
| A 6177398 | 6/1994 | Japan . |
| A 7202047 | 8/1995 | Japan . |

*Primary Examiner*—Mark V. Prenty
*Attorney, Agent, or Firm*—Sughrue, Mion, Zinn, Macpeak & Seas, PLLC

[57] ABSTRACT

There is disclosed a nonvolatile semiconductor memory device, which is capable of maintaining a high capacitance ratio even when a memory cell is formed in a micronized size without increasing the number of manufacturing steps. In a flash memory having buried diffusion layer type cells, a source region and drain regions and are formed in self alignment with a polycrystalline film pattern which has a polycrystalline silicon film having projecting and recessing parts in its upper surface.

4 Claims, 26 Drawing Sheets

NONVOLATILE SEMICONDUCTOR MEMORY DEVICE AND MANUFACTURING METHOD OF THE SAME

BACKGROUND OF THE INVENTION

1. Field of the Invention

The present invention relates to a nonvolatile semiconductor memory device and a manufacturing method of the same, and more particularly to a stacked type flash memory and a manufacturing method of the same.

2. Description of the Related Art

Conventionally, among nonvolatile semiconductor memory devices capable of performing electrical rewriting, flash memories which have functions for electrically erasing a plurality of memory cells in a required region in a flush have been available. Among these flash memories, there is one, which is composed of stacked gate type memory cells.

FIG. 1 is a typical plan view showing one construction example of a conventional flash memory composed of stacked gate type memory cells. FIG. 2(a) is a section view taken along the line X–X' of the flash memory shown in FIG. 1, and FIG. 2(b) is a section view taken along the line Y–Y' of the flash memory shown in FIG. 1.

Referring to FIGS. 1 and 2(a), on the surface of a P type silicon substrate 201, there are provided a field oxide 202 in an element isolation region and stacked gate type memory cells in an element formation region. Each of the memory cells is composed of a gate oxide film 210 provided on the surface of the P type silicon substrate 201, a floating gate electrode 215 formed of an N type polycrystalline silicon film, which is provided on the surface of the P type silicon substrate 201 via the gate oxide film 210, a gate insulating film 213 formed by stacking a silicon oxide film, a silicon nitride film and a silicon oxide film, which is provided on the surface of the floating gate electrode 215, a control gate electrode 216 formed of an N+ type polycrystalline silicon film as a word line, which is formed on the floating gate electrode 215 via the gate insulting film 213, and a source region 208 and drain regions 207a and 207b formed on the surface of the P type silicon substrate 201. Each floating gate electrode 215 belongs to each memory cell.

The source region 208 and the drain regions 207a and 207b are formed of N+ type diffusion layers, each of which is formed in self alignment with, for instance, a nitride film pattern 205. The drain regions 207a and 207b are connected to bit lines 219a and 219b formed on the surface of an interlayer insulating film 217 through contact holes 218, which are provided at each interval of 16 memory cells in the interlayer insulating film 217 covering the memory cells. The source region 208 is shared by a required number of memory cells, and as in the case of the drain regions 207a and 207b, each source region 208 is connected through the contact hole 218 to a source line 220, which is formed on the surface of the interlayer insulating film 217.

In the flash memory of this type constituted as above, N+ type diffusion layers are used as sub-bit and sub-source lines. Instead of one contact hole provided for one memory cell, drain and source regions composed of the N+ type diffusion layers are shared. For a plurality of memory cells, one contact hole exists in the drain region and one in the source region. The existence of one contact hole for the plurality of memory cells makes it possible to reduce the areas of the memory cells and is thus effective for the reduction of a chip size. The memory cell construction described above is referred to as a buried diffusion layer type flash memory, hereinafter.

Data writing and erasing operations for the above-noted buried diffusion layer type flash memory are summarized as follows with a voltage applied to the drain regions 207a and 207b, a voltage applied to the source region 208, a voltage applied to the control gate electrode 216 and a voltage applied to the P type silicon substrate 201 respectively set to $V_{DD}$, $V_{SS}$, $V_{CG}$ and $V_{SUB}$.

Memory cell writing implies pulling out of electrons injected into the floating gate electrode 215 therefrom. For example, writing is performed by respectively applying $V_{CG}=-9V$ to the control gate electrode 216 which belongs to a memory cell targeted for writing, $V_{DD}=5V$ to the drain regions 207a and 207b and $V_{SUB}=0V$ to the P type silicon substrate 201 and opening the source region 208. During this period, in the control gate electrode 216 selected for writing and the memory cell which belongs to the drain region 207, an electric field applied to the gate oxide film 210 is higher than those of the other memory cells. Consequently, a Fowler-Noldheim current (referred to as a FN current, hereinafter) based on a quantum tunnel effect flows, and thus electrons are pulled out of the floating gate electrode 215 of this memory cell. A threshold voltage of the memory cell is shifted in a negative direction and reduced from about 5V to about 2V.

Erasing of the memory cell is performed by injecting electrons into the floating gate electrode 215. Erasing in the flash memory is performed for each memory array. For example, erasing is performed by respectively applying $V_{CG}=16V$ to the control gate electrode 216, $V_{DD}=0V$ to the drain region 207, $V_{SUB}=0V$ to the P type silicon substrate 201 and $V_{SS}=0V$ to the source region 208. Thus, a high electric field is applied to each gate oxide film 210 of all the memory cells which belong to the control gate electrode 216. Consequently, an FN current based on the quantum tunnel effect flows as in the case of writing and accordingly electrons are injected into the floating gate electrode 215 of this memory cell. A threshold voltage of the memory cell is shifted in a positive direction and increased from about 2V to about 5V.

A manufacturing method of the flash memory constructed in the above-noted manner will be described below.

FIGS. 3 to 13 are typical plan views each illustrating a manufacturing method of the flash memory shown in FIG. 2.

First, a field oxide 202 is formed in the element isolation region of the surface of the P type silicon substrate 201. Subsequently, a first oxide film 203 having a thickness of 4 nm is formed and then a nitride film 204 having a thickness of about 300 nm is grown on the full surface (FIG. 3).

Then, the nitride film 204 is patterned in a striped form and a nitride film pattern 205 is formed. Thereafter, by using the nitride film pattern 205 as a mask, arsenic ions of 5E15 cm-2 are implanted at 70 KeV approximately in parallel with a normal on the surface of the P type silicon substrate 201, and an arsenic ion implanted layer 206 is formed in the P type silicon substrate 201 (FIG. 4).

Then, the arsenic ion implanted layer is subjected to a heat treatment in a nitrogen atmosphere of 850° C. for 30 minutes. By this heat treatment, the arsenic ion implanted layer 206 is activated and drain regions 207a and 207b and a source region 208 composed of N+ diffusion layers are formed (FIG. 5).

Then, by performing thermal oxidation at a temperature of 850° C., second oxide films 209a, 209b and 209c each having a thickness of about 100 nm are formed on the drain regions 207a and 207b and the source region 208 (FIG. 6).

Then, the nitride film pattern 205 and the first oxide film 203 are removed in sequence by etching, and a portion of the surface of the P type silicon substrate 201 is exposed (FIG. 7).

Then, a gate oxide film 210 having a thickness of about 8 nm is formed in the element formation region of the surface of the P type silicon substrate 201 by thermal oxidation, and thereafter a first N type polycrystalline silicon film 211 is formed on the entire surface (FIG. 8).

Then, the first polycrystalline silicon film 211 is patterned on a stripe-like polycrystalline silicon film 212 so as to be in parallel with the bit line (FIG. 9).

Then, a gate insulating film 213 is formed on the entire surface (FIG. 10).

Then, a second N+ type polycrystalline silicon film 214 is formed on the entire surface (FIG. 11).

Then, the second polycrystalline silicon film 214, the gate insulating film 213 and the polycrystalline silicon film pattern 212 are sequentially patterned, and thereby a control gate electrode 216 composed of the second polycrystalline silicon film 214 and a floating gate electrode 215 composed of the polycrystalline silicon film pattern 212 are formed. Subsequently, by thermal oxidation, silicon oxide films (not shown) each having a thickness of 10 to 20 nm are formed in the exposed surfaces of the control gate electrode 216 and the floating gate electrode 215 and the surface of the P type silicon substrate 201 (FIG. 12).

Then, an interlayer insulating film 217 formed of a BPSG film having a thickness of about 0.8 μm is formed on the entire surface, and subsequently a contact hole 218, and so on, reaching the drain regions 207a and 207b and the source region 208 are formed. An area of the bit contact hole 218 is 0.4 μm². Thereafter, an aluminum metallic film having a thickness of about 0.45 μm is formed on the entire surface. By patterning this metallic film, bit lines 219a, 219b, a source line 220, and so on, are formed (FIG. 13).

However, in the conventional flash memory described above, because the drain regions and the source region cannot be formed in self alignment with the polycrystalline films, its manufacturing process becomes long and micro fabrication of memory cells is difficult.

In the conventional manufacturing method described above, first, the drain regions and the source region were formed in self alignment with the nitride film pattern, and then when the width of the nitride film pattern was set to, for instance 0.4 μm, the capacitance ratio of the memory cell was set to, for instance about 0.7 by greatly increasing the width of the polycrystalline silicon film pattern to, for instance 1.45 μm.

The capacitance ratio of the memory cell will be described below.

The memory cell capacitance ratio is an important parameter for the operations of the memory cell, which includes writing, erasing and reading operations. The capacitance ratio is defined by the following formula.

$$Vfg = \alpha(Vcg - \Delta Vth)$$

$$\alpha = Cfg/Ct$$

Herein,

Vfg: Potential of floating gate electrode
Vcg: potential of control gate electrode
α: Capacitance ratio
ΔVth: Shifting amount of memory cell threshold voltage Cfg: Capacitance between floating gate electrode and control gate electrode
Ct: Capacitance of all around floating gate electrode From the above-noted formula, it should be understood that when a certain voltage is applied to the control gate, a voltage applied between the floating gate electrode and the P type silicon substrate is a value obtained by multiplying the voltage applied to the control gate electrode by a capacitance ratio.

For writing and erasing operations in the conventional memory cell described above, an FN tunneling phenomenon is utilized. By this method, compared with, for instance a channel hot electron injecting method, the consumption of currents during writing and erasing can be reduced more. Accordingly, the method is suited for reducing of a power supply voltage, which has been demanded of the flash memory in recent years.

However, in order to perform writing and erasing by using the FN tunneling phenomenon, it is necessary to apply a high electric field to the gate oxide film. In other words, if a capacitance ratio is taken into consideration, a higher voltage must be applied to the control gate electrode. Here, in order to generate a high voltage inside a chip, a dedicated circuit is necessary, and thus as a voltage is higher, an area occupied by the circuit in the chip is larger. In order to reduce the chip area, a voltage applied to the control gate electrode must be reduced as much as possible. Accordingly, it is necessary to set the capacitance ratio of the memory cell to a high level and increase an electric field applied to the gate oxide film when an FN tunneling phenomenon occurs.

SUMMARY OF THE INVENTION

The present invention was made in order to solve the problems of the prior art discussed above. It is an object of the present invention to provide a nonvolatile semiconductor memory device capable of maintaining a high capacitance ratio even when a memory cell is formed in a micronized size without increasing the number of manufacturing steps in a flash memory which is composed of buried diffusion layer type cells, and a manufacturing method of the same.

In order to achieve the above-noted object, there is provided a nonvolatile semiconductor memory device according to an aspect of the present invention.

The nonvolatile semiconductor memory device having memory cells comprises:

a floating gate electrode provided on the surface of a semiconductor substrate through a gate oxide film;

a control gate electrode provided on the surface of the floating gate electrode interposing a gate insulating film and functions also as a word line;

a drain region provided on the surface of the semiconductor substrate, the drain region being connected to a bit line composed of an N+ type diffusion layer orthogonally crossing the word line; and a source region provided on the surface of the semiconductor substrate, the source region being connected to a source line composed of an N+ type diffusion layer orthogonally crossing the word line.

In the memory device having the above-described constitution, the floating gate electrode has projecting and recessing parts in its upper surface. The semiconductor substrate is a P type silicon substrate.

There is also provided a method for manufacturing a nonvolatile semiconductor memory device.

The manufacturing method comprises the steps of forming a gate oxide film in an element formation region of a semiconductor substrate surface by thermal oxidation;

forming an N type polycrystalline silicon film of a predetermined impurity concentration on the entire surface of the semiconductor substrate, the N type polycrystalline silicon film having projecting and recessing parts in an upper surface thereof; forming a gate insulating film on the entire surface of the semiconductor substrate;

forming a predetermined polycrystalline silicon film pattern by sequentially patterning the gate insulating film and the polycrystalline silicon film using a first photoresist film pattern as a mask;

forming an arsenic ion implanted layer by implanting arsenic ions in parallel with a normal to the surface of the semiconductor substrate with the first photoresist film pattern used as a mask;

forming drain and source regions composed of N+ type diffusion layers on a surface of the semiconductor substrate by removing the first photoresist film pattern and performing a heat treatment at a specified temperature so as to activate the arsenic ion implanted layer;

forming oxide films on the drain and source regions in the surface of the semiconductor substrate by thermal oxidation;

forming a control gate electrode composed of a conductive film and a floating gate electrode composed of the polycrystalline silicon film pattern by forming a conductive film on the entire surface of the semiconductor substrate and sequentially patterning the conductive film, the gate insulating film and the polycrystalline silicon film pattern; and forming an interlayer insulating film on the entire surface of the semiconductor substrate, a contact hole reaching the N+ type diffusion layer in the interlayer insulating film and bit and source lines respectively connected to the drain and source regions interposing the contact hole on the surface of the interlayer insulating film.

In order to achieve the above-described object, there is provided a nonvolatile semiconductor memory device according to another aspect of the present invention.

The nonvolatile semiconductor memory device having memory cells comprises:

a floating gate electrode provided on a surface of a semiconductor substrate through a gate oxide film;

a control gate electrode provided on a surface of the floating gate electrode through a gate insulating film, the control gate serving also as a word line;

a drain region provided on the surface of the semiconductor substrate, the drain region being connected to a bit line composed of an N+ type diffusion layer orthogonally crossing the word line;

a source region provided on the surface of the semiconductor substrate, the source region being connected to a source line composed of an N+ type diffusion layer orthogonally crossing the word line; and a side wall oxide film formed on a side face of the floating gate electrode and above the drain and source regions.

In the semiconductor memory device having the above-described constitution, the floating gate electrode has projecting and recessing parts in an upper surface thereof.

The semiconductor substrate is a P type silicon substrate.

There is also provided a method for manufacturing a nonvolatile semiconductor memory device.

The manufacturing method comprises the steps of:

forming a gate oxide film in an element formation region of a semiconductor substrate surface by thermal oxidation;

forming an N type polycrystalline silicon film of a predetermined impurity concentration on the entire surface of semiconductor substrate, the N type polycrystalline silicon film having projecting and recessing parts in an upper surface thereof;

forming a predetermined polycrystalline silicon film pattern by patterning the polycrystalline film with a first photoresist film pattern;

forming an arsenic ion implanted layer by implanting arsenic ions in parallel with a normal to the surface of the semiconductor substrate using the first photoresist film pattern as a mask;

forming drain and source regions composed of N+ type diffusion layers on the surface of the semiconductor substrate by removing the first photoresist film pattern and performing a heat treatment at a specified temperature so as to activate the arsenic ion implanted layer;

forming a side wall oxide film on a side face of the polycrystalline silicon film pattern by depositing an oxide film on the entire surface of the semiconductor substrate and performing anisotropic etching;

forming oxide films on the drain and source regions of the semiconductor substrate surface by thermal oxidation;

forming a control gate electrode composed of a conductive film and a floating gate electrode composed of the polycrystalline silicon film pattern by forming the conductive film on the entire surface of the semiconductor substrate and sequentially patterning the conductive film, the gate insulating film and the polycrystalline silicon film pattern; and forming an interlayer insulating film on the entire surface of the semiconductor substrate, a contact hole reaching the N+ type diffusion layer in the interlayer insulating film and bit and source lines respectively connected to the drain and source regions through the contact hole on the surface of the interlayer insulating film.

There is provided another method for manufacturing a nonvolatile semiconductor memory device described above.

The manufacturing method comprises the steps of:

forming a gate oxide film in an element formation region of a semiconductor substrate surface by thermal oxidation;

forming an N type polycrystalline silicon film of a predetermined impurity concentration on the entire surface of the silicon substrate, the N type polycrystalline silicon film having projecting and recessing parts in an upper surface thereof;

forming a specified polycrystalline silicon film pattern by patterning the polycrystalline silicon film with a first photoresist film pattern;

forming a second photoresist film pattern covering at least a region planned for source formation, the second photoresist film pattern having an opening part in a region planned for drain formation;

forming a second arsenic ion implanted layer in the semiconductor substrate by implanting arsenic ions of a quantity to form a first high impurity concentration region by first implanting energy in parallel with a normal to the surface of the semiconductor substrate using the second photoresist film pattern as a mask;

forming a drain region composed of a first N+ type diffusion layer on the surface of the semiconductor substrate by removing the second photoresist film pattern and performing a first heat treatment at a specified temperature so as to activate the second arsenic ion implanted layer;

forming a side wall oxide film on the side face of the polycrystalline silicon film pattern by depositing an oxide film on the entire surface of the semiconductor substrate and performing anisotropic etching;

forming a third photoresist film pattern covering at least a region planned for drain formation, the third photoresist film pattern having an opening in a region planned for source formation; forming a third arsenic ion implanted layer in the semiconductor substrate by implanting arsenic ions of a quantity to form a second high impurity concentration region by second implanting energy in parallel with a normal to the surface of the semiconductor substrate using the third photoresist film pattern as a mask;

forming a source region composed of a second N+ type diffusion layer on the surface of the semiconductor substrate by forming an oxide film on the surface of the semiconductor substrate by a thermal oxidizing method;

eliminating the third photoresist film pattern and activating the third arsenic ion implanted layer;

forming a control gate electrode composed of a conductive film and a floating gate electrode composed of the polycrystalline silicon film pattern by sequentially forming a gate insulating film and the conductive film on the entire surface of the semiconductor substrate and patterning the conductive film, the gate insulating film and the polycrystalline silicon film pattern; and forming a interlayer insulating film on the entire surface of the semiconductor substrate, a contact hole reaching the N+ type diffusion layer in the interlayer insulating film and the bit and source lines respectively connected to the drain and source regions through the contact hole on the surface of the interlayer insulating film.

With the nonvolatile semiconductor memory device of the present invention constructed in the manner described above, since there are formed projecting and recessing parts on the surface of the polycrystalline silicon film, in which the floating gate electrode is formed, the surface area of the floating gate is increased and a capacitance ratio of the memory cell is increased.

A voltage necessary for writing and erasing is obtained by multiplying a capacitance ratio by a voltage applied to the control gate electrode. When a capacitance ratio is large, FN tunneling occurs even if a low voltage is applied to the control gate electrode. Accordingly, it is not necessary to increase the number of manufacturing steps.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

The preferred embodiments of the present invention will be described below with reference to the accompanying drawings.

Figure 1:
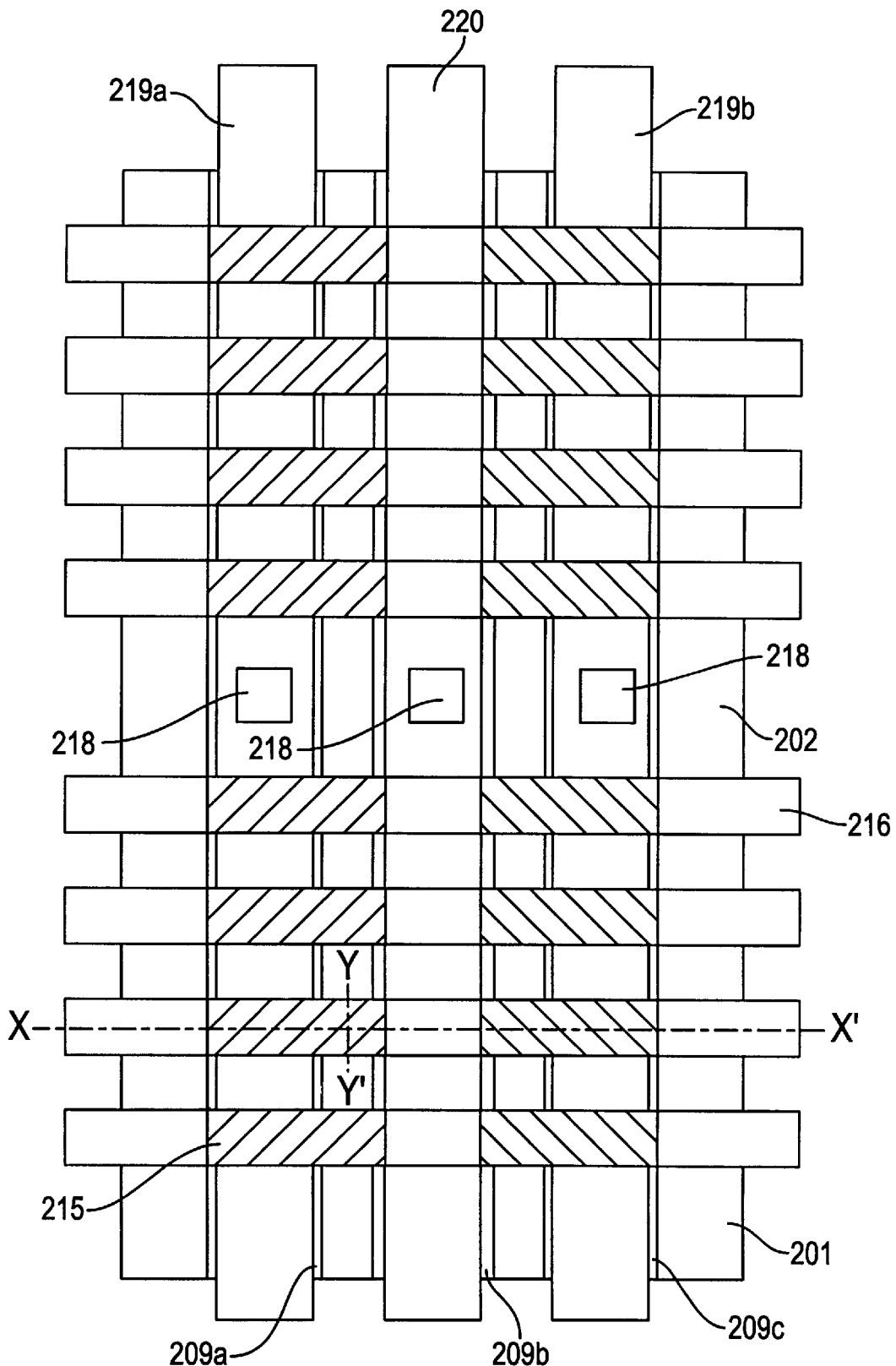
FIG. 1 is a typical plan view showing one construction example of a conventional flash memory composed of stacked gate type memory cells.
Figure 2A:
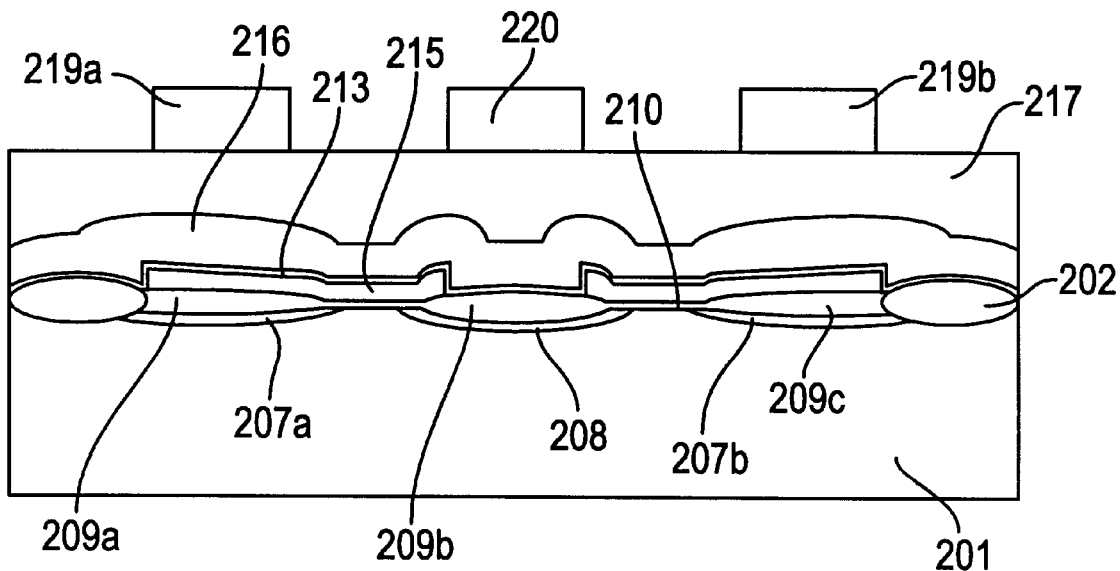
FIG. 2(a) is a section view taken along a line X–X' of the flash memory shown in FIG. 1.
Figure 2B:
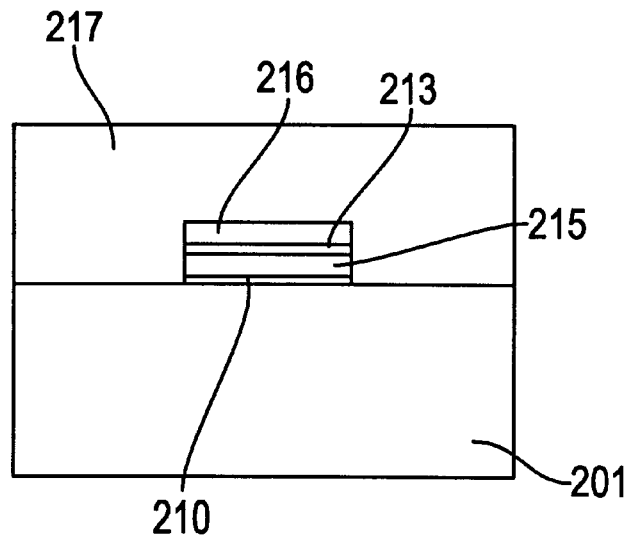
FIG. 2(b) is a section view taken along a line Y–Y' of the flash memory shown in FIG. 1.
Figure 3:
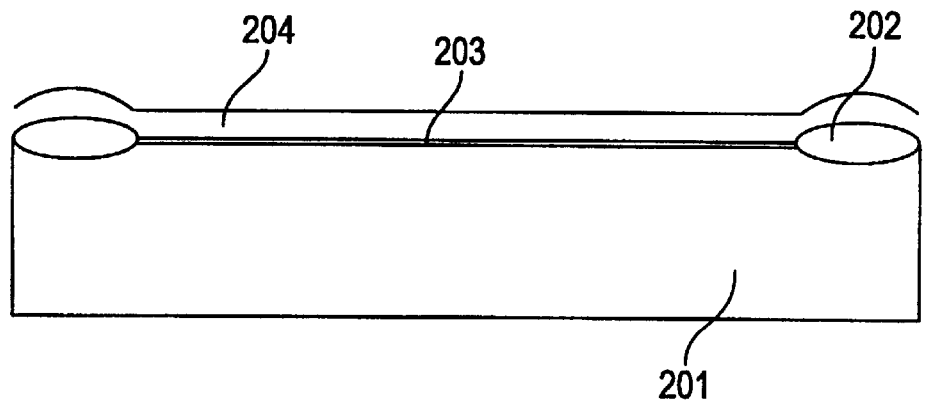
FIG. 3 is a typical section view illustrating a manufacturing method of the flash memory shown in FIGS. 1 and 2.
Figure 4:
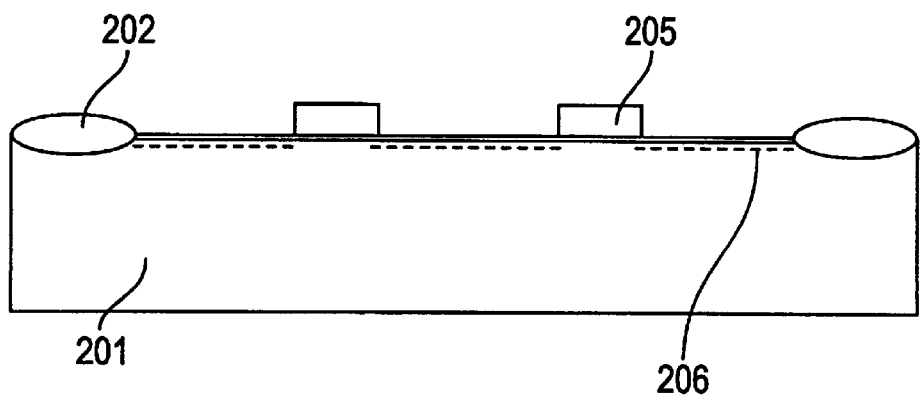
FIG. 4 is a typical section view illustrating the manufacturing method of the flash memory shown in FIGS. 1 and 2.
Figure 5:
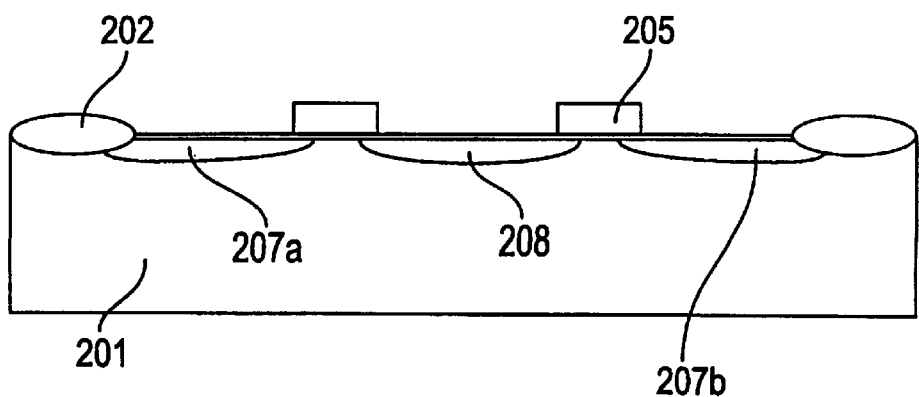
FIG. 5 is a typical section view illustrating the manufacturing method of the flash memory shown in FIGS. 1 and 2.
Figure 6:
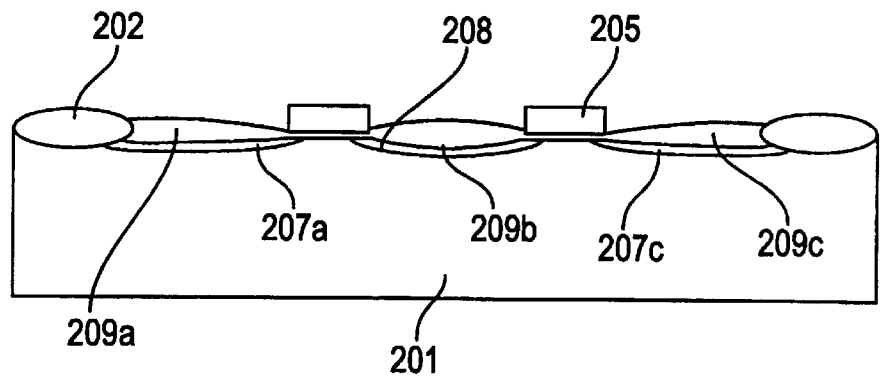
FIG. 6 is a typical section view illustrating the manufacturing method of the flash memory shown in FIGS. 1 and 2.
Figure 7:
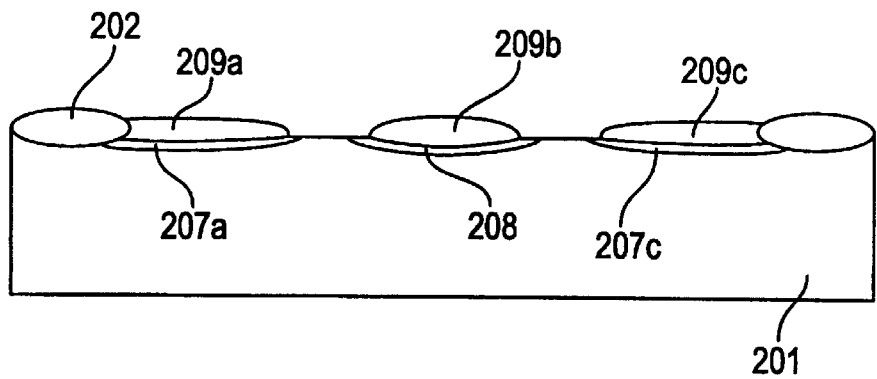
FIG. 7 is a typical section view illustrating the manufacturing method of the flash memory shown in FIGS. 1 and 2.
Figure 8:
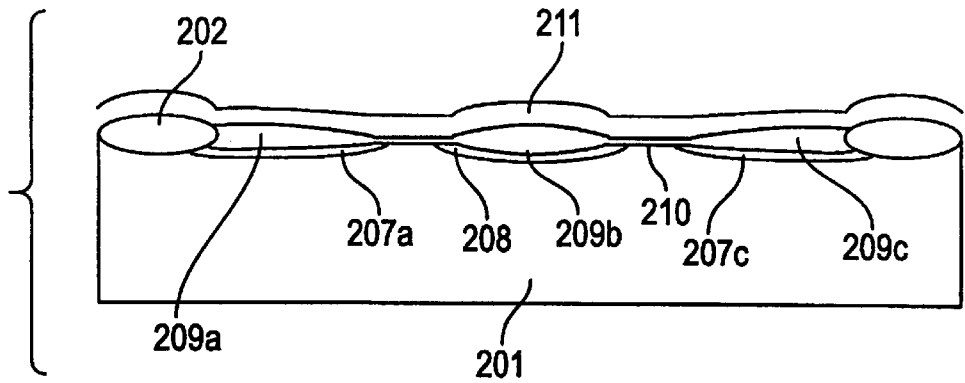
FIG. 8 is a typical section view illustrating the manufacturing method of the flash memory shown in FIGS. 1 and 2.
Figure 9:
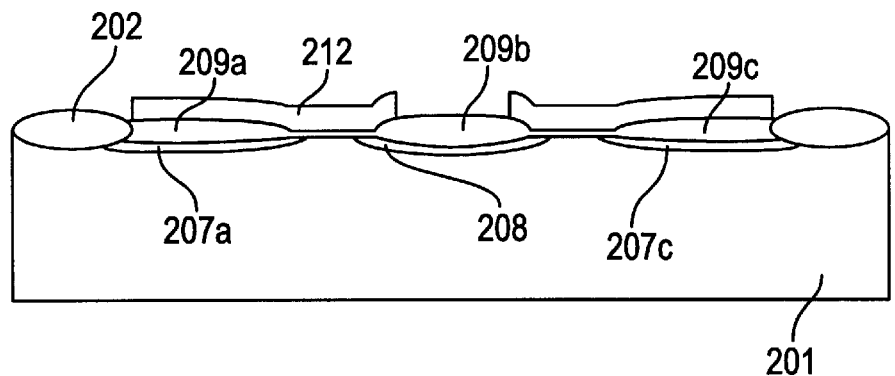
FIG. 9 is a typical section view illustrating the manufacturing method of the flash memory shown in FIGS. 1 and 2.
Figure 10:
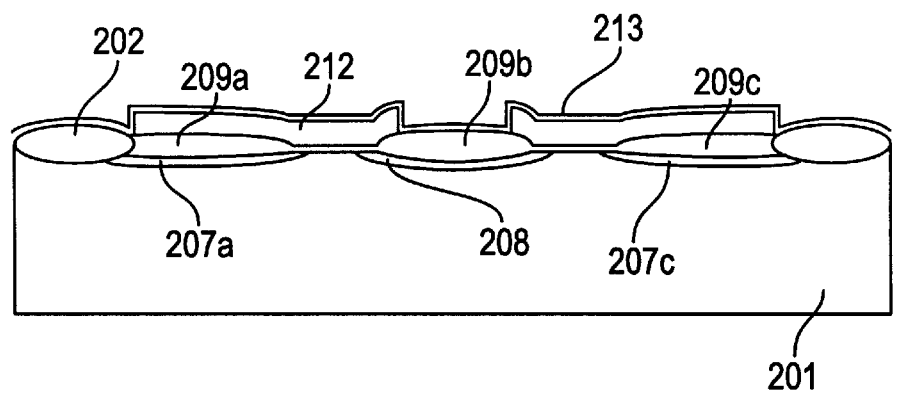
FIG. 10 is a typical section view illustrating the manufacturing method of the flash memory shown in FIGS. 1 and 2.
Figure 11:
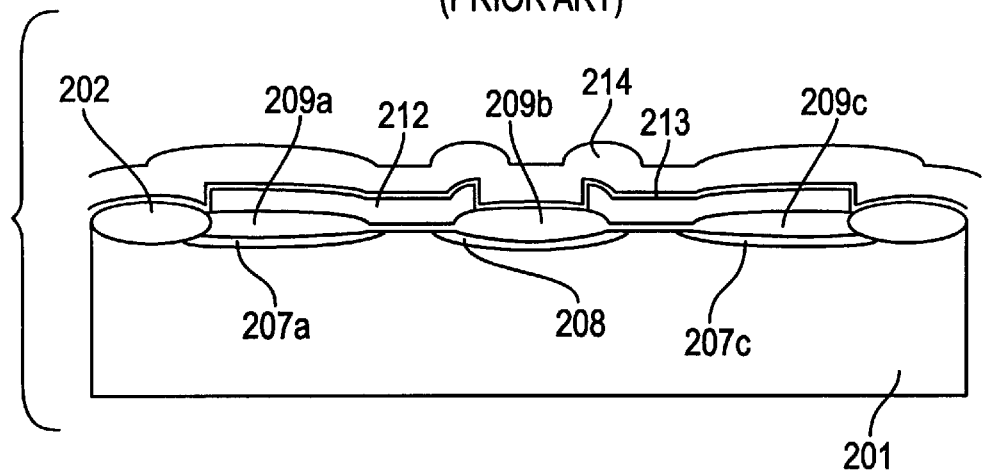
FIG. 11 is a typical section view illustrating the manufacturing method of the flash memory shown in FIGS. 1 and 2.
Figure 12:
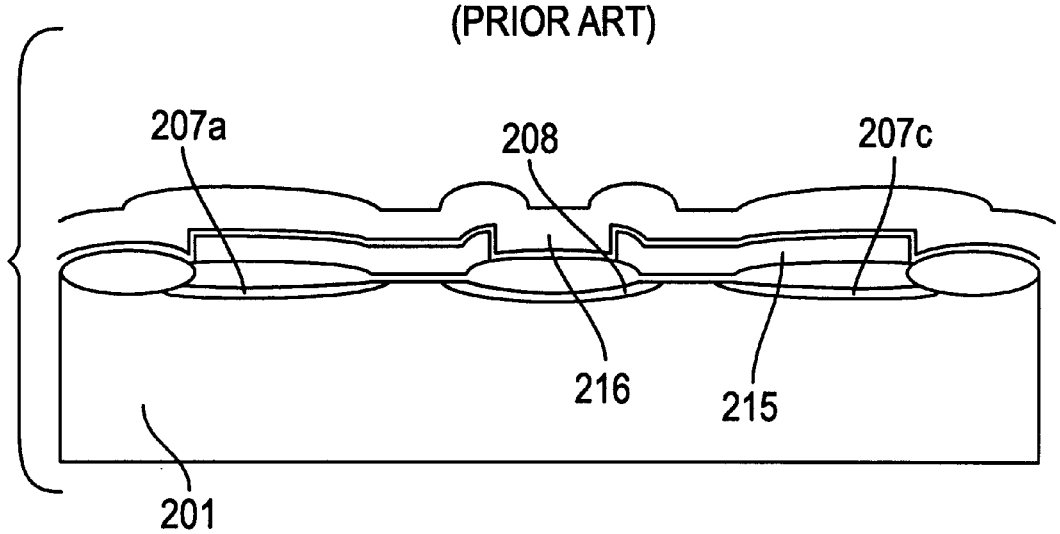
FIG. 12 is a typical section view illustrating the manufacturing method of the flash memory shown in FIGS. 1 and 2.
Figure 13:
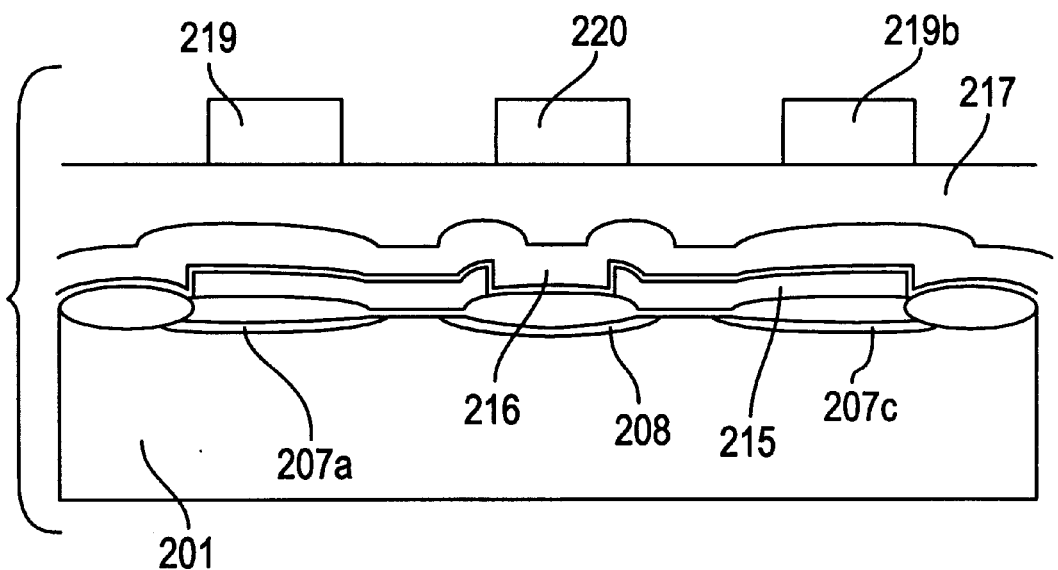
FIG. 13 is a typical section view illustrating the manufacturing method of the flash memory shown in FIGS. 1 and 2.
Figure 14:
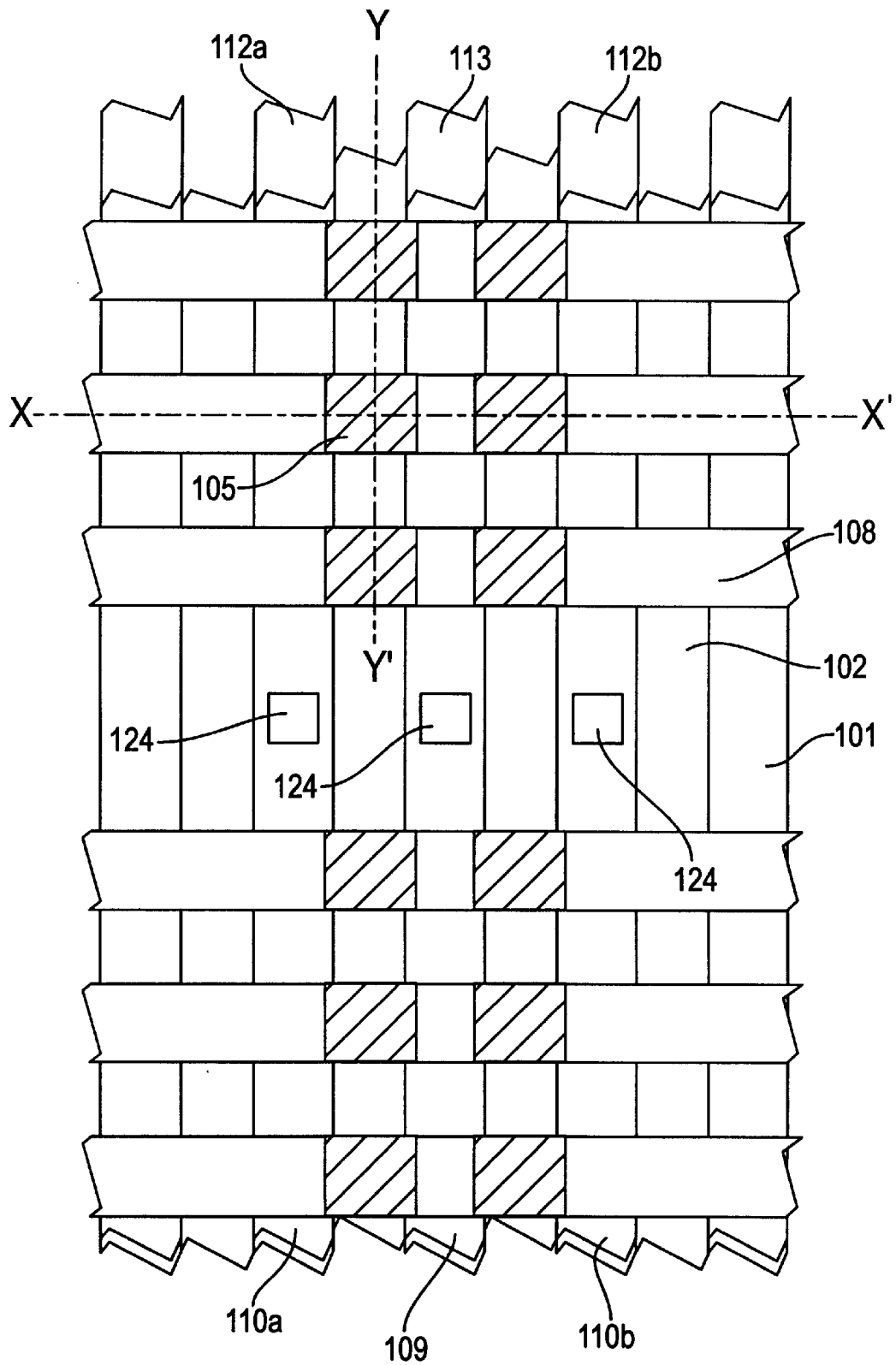
FIG. 14 is a typical plan view showing an embodiment of a nonvolatile semiconductor memory device of the present invention.

FIG. 14 is a typical plan view showing an embodiment of the nonvolatile semiconductor memory device of the present invention.

(First Embodiment)

Figure 15A:
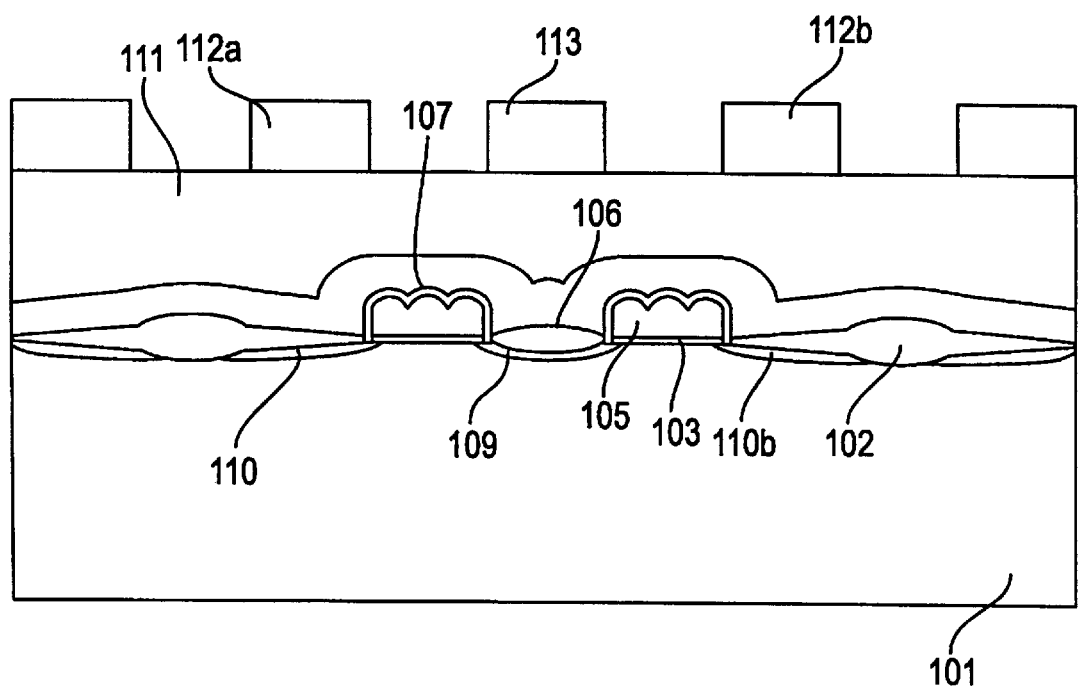
FIG. 15(a) is a section view taken along a line X–X' showing a first embodiment of the nonvolatile semiconductor memory device shown in FIG. 14.
Figure 15B:
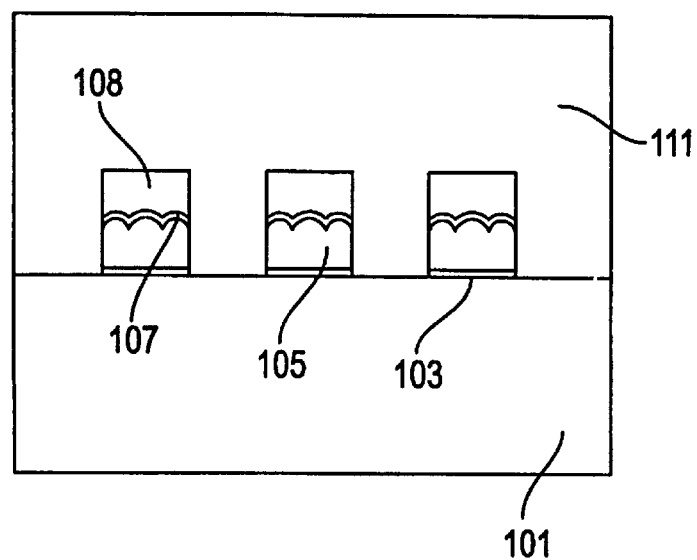
FIG. 15(b) is a section view taken along a line Y–Y' showing the first embodiment of the nonvolatile semiconductor memory device shown in FIG. 14.

FIG. 15(a) is a view taken along a line X–X' showing a first embodiment of the nonvolatile semiconductor memory device shown in FIG. 14. FIG. 15(b) is a view taken along a line Y–Y' showing the first embodiment of the nonvolatile semiconductor memory device shown in FIG. 14.

On the surface of a P type silicon substrate 101 as a semiconductor substrate which has a plane orientation <100> and surface impurity concentration of about $2 \times 10^{17}$ $cm^{-3}$, there are provided a field oxide 102 having a thickness of about 0.5 $\mu$m in an element isolation region and stacked gate type memory cells in an element formation region. Each of the memory cells is provided so as to have a gate oxide film 103 having a thickness of about 7.5 nm, which is formed on the surface of the P type silicon substrate 101, and a floating gate electrode 105 having impurity concentration of about $1 \times 10^{19}$ $cm^{-3}$ on the surface of the P type silicon substrate 101 through the gate oxidefilm 103 and composed of an N type polycrystalline silicon film 104 having a thickness of about 150 nm and projecting and recessing parts in its upper surface, a gate insulating film 107 which is provided on the surface of the floating gate electrode 105 and formed by stacking a silicon oxide film of a thickness of about 7 nm, a silicon nitride film of a thickness of about 7 nm and a silicon oxide film of a thickness of about 2 nm, a control gate electrode 108 which is provided on the floating gate electrode 105 through the gate insulating film 107 and functions as a word line and a source region 109 and drain regions 110a and 110b which are provided on the surface of the P type silicon substrate 101. Each floating gate electrode 105 belongs to each memory cell. A distance according to the word line method of the floating gate electrode 105 is set to, for instance 0.3 µm, widths of the source region 109 and the drain regions 110a and 110b are set to 0.3 µm and a width of the field oxide film 102 is set to 0.3 µm.

The source region 109 and the drain regions 110a and 110b are composed of N+ type diffusion layers, which are in self alignment with, for instance a polycrystalline silicon film pattern 117. The drain regions 110a and 110b are connected to bit lines 112a and 112b provided on the surface of an interlayer insulating film 111 via contact holes 124, which are formed in the interlayer insulating film 111 for covering the surfaces the memory cells, for instance at each interval of 16 memory cells. The source region 109 is shared by a required number of memory cells, and as in the case of the drain regions 110a and 110b, each source region 109 is connected through the contact hole 124 to a source line 113 which is provided on the surface of the interlayer insulating film 111.

The manufacturing method of the nonvolatile semiconductor memory device constructed in the manner described above will be described below.

FIGS. 16 to 22 are typical section views each illustrating the manufacturing method of the nonvolatile semiconductor memory device shown in FIG. 15.

Figure 16:
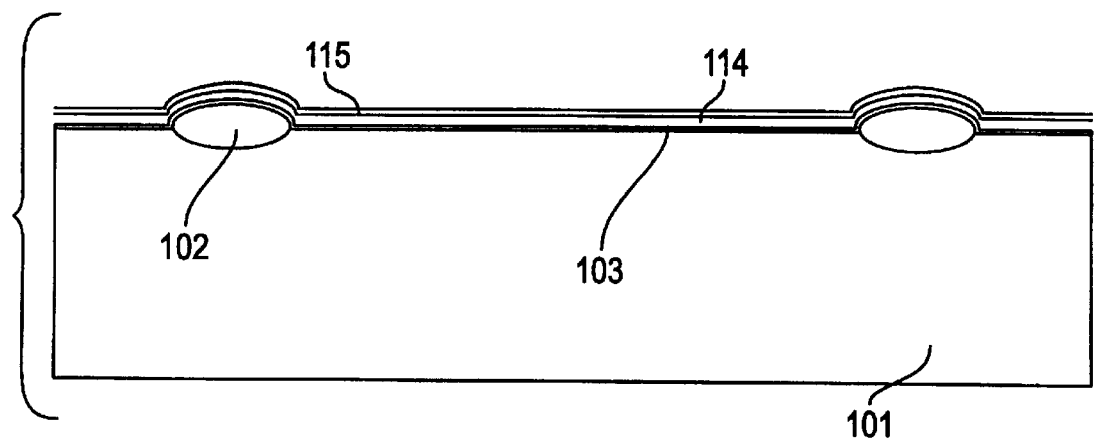
FIG. 16 is a typical section view illustrating a manufacturing method of the nonvolatile semiconductor memory device shown in FIG. 15.

First, a field oxide film 102 is formed in the element isolation region formed in the surface of the P type silicon substrate 101, and a gate oxide film 103 is formed in the element formation region formed in the surface of the P type silicon substrate 101 by thermal oxidation. An N type first polycrystalline silicon film 114 and an amorphous silicon film 115 are then formed on the entire surface (FIG. 16).

Then, the amorphous silicon film 115 is irradiated with di-silane, and a nucleus (not shown) is formed on the surface of the amorphous silicon film 115. Thereafter, by performing a high-temperature heat treatment in di-silane atmosphere, a grain is grown around the nucleus. Consequently, the amorphous silicon film 115 is crystallized to be the same as a first polycrystalline silicon film 114, and a polycrystalline silicon film 104 having projecting and recessing parts in its upper surface is formed. Because of these projecting and recessing parts, the surface area of the upper surface of the polycrystalline silicon film 104 is increased.

Figure 17:
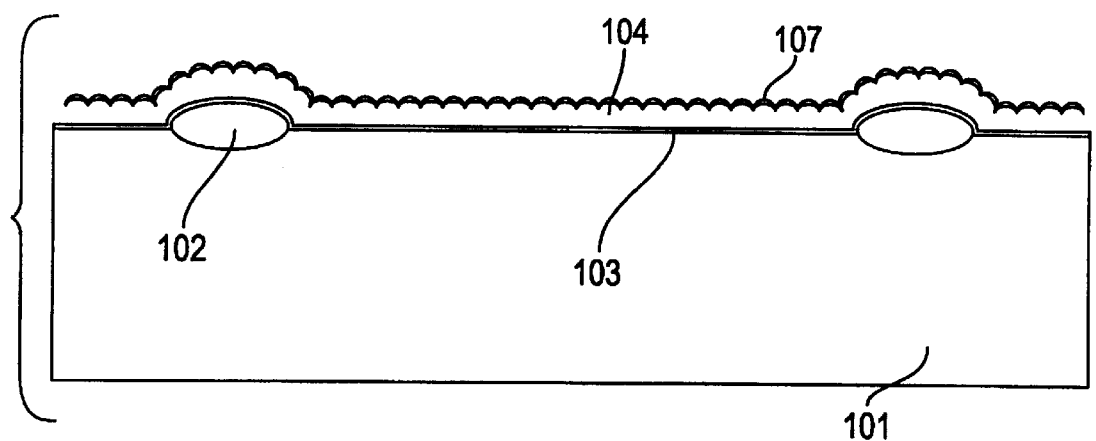
FIG. 17 is a typical section view illustrating the manufacturing method of the nonvolatile semiconductor memory device shown in FIG. 15.

Then, a silicon oxide film (not shown) having a thickness of about 7 nm is formed on the entire surface by a high-temperature vapor growth method, and a silicon nitride film (not shown) is formed also on the entire surface by a vacuum vapor growth method (LPCVD). Thereafter, by forming a silicon oxide film (not shown) having a thickness of about 2 nm by the high-temperature vapor growth method, a gate insulating film 107 having a total thickness of about 12.5 nm is formed on the entire surface (FIG. 17). In the embodiment, the polycrystalline silicon film 104 having projecting and recessing parts in its upper surface is composed of the first polycrystalline silicon film 114 and the amorphous silicon film 115. However, other films may be used for composition of the first polycrystalline silicon film 104. In fact, the effectiveness of the present invention will not be lost as long as there is provided a polycrystalline silicon film having, projecting and recessing parts in its upper surface.

Figure 18:
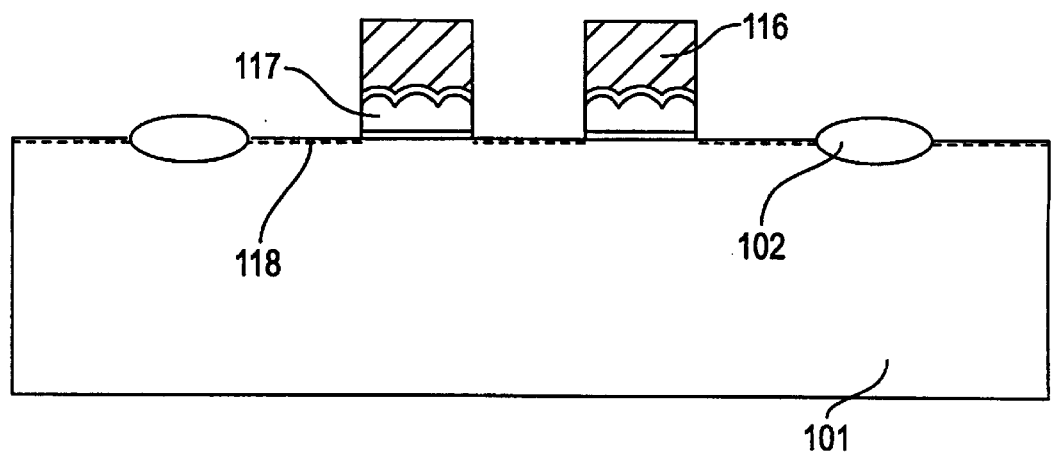
FIG. 18 is a typical section view illustrating the manufacturing method of the nonvolatile semiconductor memory device shown in FIG. 15.

Then, with a first photoresist film pattern 116 used as a mask, the gate insulating film 107 and the polycrystalline silicon film 104 having projecting and recessing parts in its upper surface are patterned so as to form a polycrystalline silicon film pattern 117, which is linear in parallel with the bit line. Thereafter, by implanting arsenic ions of 5×15 cm$^{-2}$ at 70 KeV approximately in parallel with a normal to the surface of the P type silicon substrate 101, a first arsenic ion implanted layer 118 is formed (FIG. 18).

Figure 19:
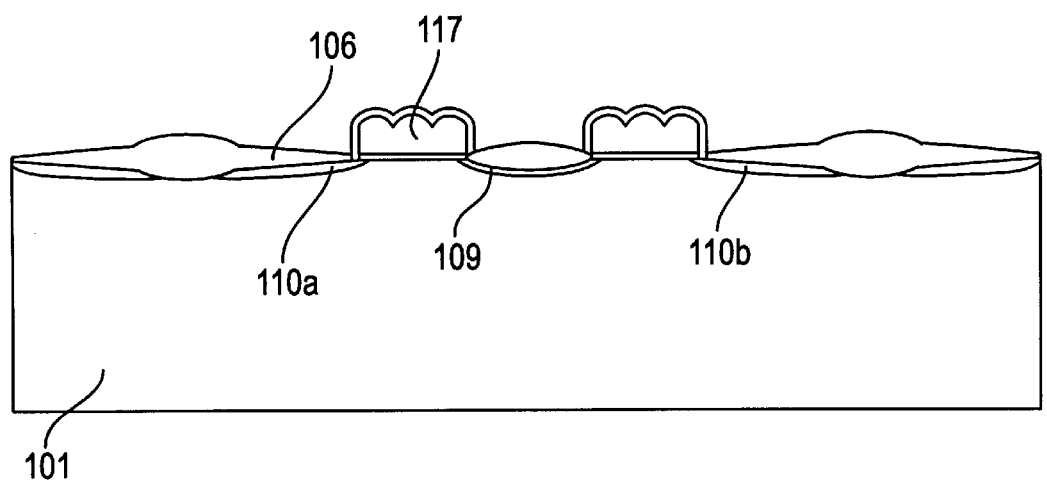
FIG. 19 is a typical section view illustrating the manufacturing method of the nonvolatile semiconductor memory device shown in FIG. 15.

Then, the photoresist film pattern 116 is eliminated, and a heat treatment is then performed in nitrogen atmosphere of 850° C. for about 30 minutes. By this heat treatment, the first arsenic ion implanted layer 118 is activated, and a source region 109 and drain regions 110a and 110b which are composed of N+ type diffusion layers are formed. Subsequently, by a thermal oxidizing method of 850° C., the surfaces of the P type silicon substrate 101 and the polycrystalline silicon film pattern 117 are oxide, and an oxide film 106 having a thickness of about 100 nm is formed on the surface of the P type silicon substrate 101 on the source region 109 and the drain regions 110a and 110b (FIG. 19).

Figure 20:
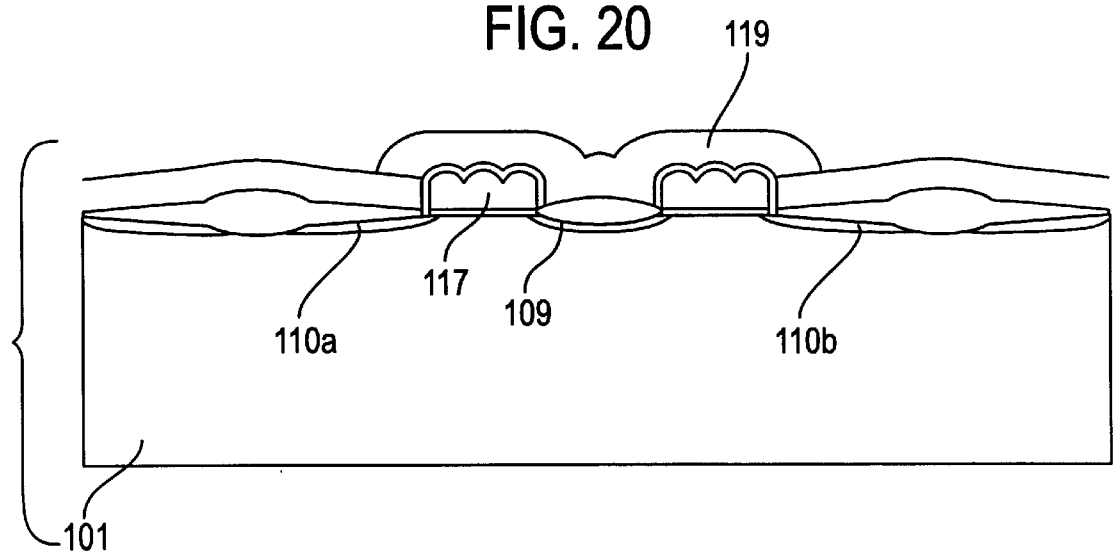
FIG. 20 is a typical section view illustrating the manufacturing method of the nonvolatile semiconductor memory device shown in FIG. 15.

Then, an N+ type second polycrystalline silicon film 119 is formed on the entire surface (FIG. 20).

Then, patterning is performed for the second polycrystalline silicon film 119 as a conductive layer, the gate insulating film 107 and the polycrystalline silicon film pattern 117 in sequence, whereby thereby a control gate electrode 108 composed of the second polycrystalline silicon film 119 and a floating gate electrode 105 composed of the polycrystalline silicon film 117 are formed. In the embodiment, the control gate electrode 108 is formed by using the N+ type second polycrystalline silicon film 119 as a raw material. However, other raw materials may be used. For example, the control gate electrode may be composed of a polycide film or a silicide film.

Figure 21:
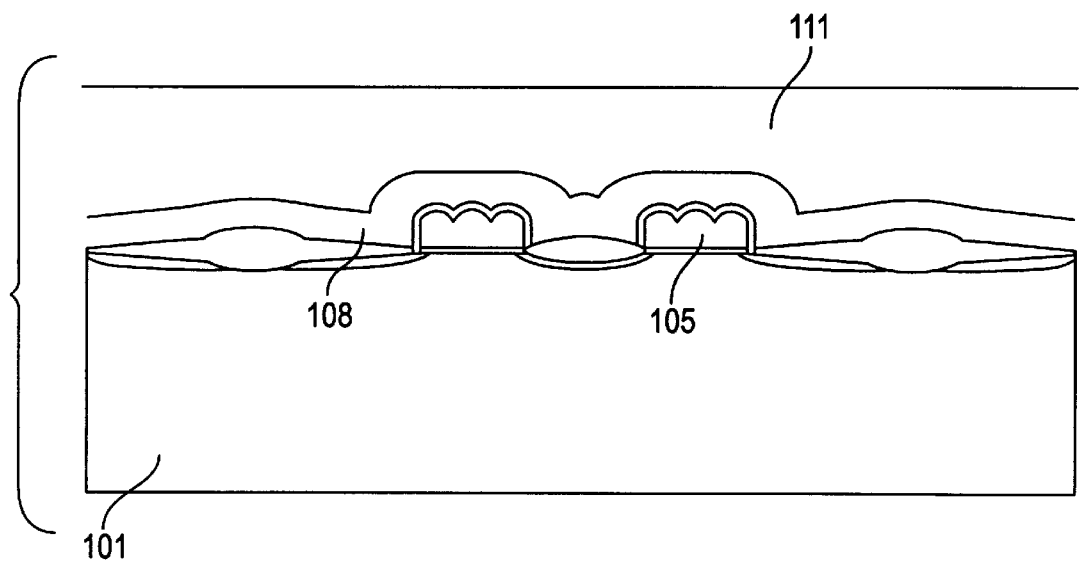
FIG. 21 is a typical section view illustrating the manufacturing method of the nonvolatile semiconductor memory device shown in FIG. 15.

Then, an interlayer insulating film 111 composed of a BPSG film having a thickness of about 0.8 µm is formed on the entire surface (FIG. 21). If the control gate electrode 108, and so on, are not composed of N+ type polycrystalline silicon films, it is preferred to form a silicon oxide film having a required thickness only in the BPSG film by the high-temperature vapor growth method, and so on, beforehand.

Figure 22:
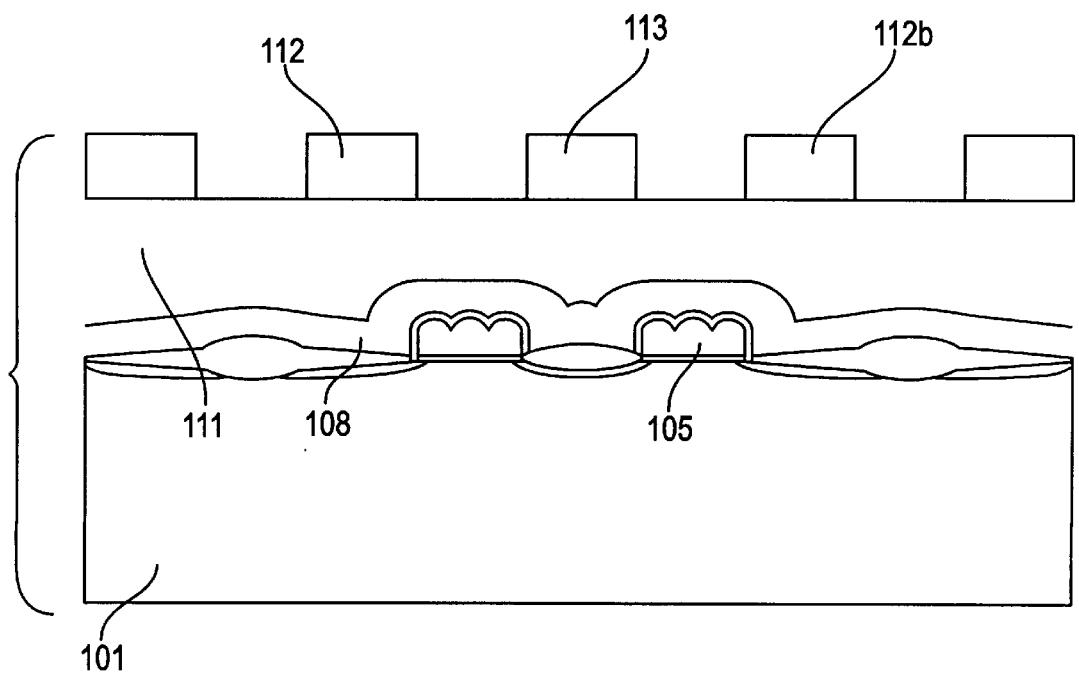
FIG. 22 is a typical section view illustrating the manufacturing method of the nonvolatile semiconductor memory device shown in FIG. 15.

Then, contact holes (not shown) which reach the drain regions 110a and 110b and the source region 109 are formed in the interlayer insulating film 111. Subsequently, an aluminum metallic film having a thickness of about 0.45 µm is formed on the entire surface, and by patterning this metallic film, bit lines 112a and 112b and a source line 113 are formed (FIG. 22).

A writing condition for the memory cell constructed in the manner described above is different from that for the conventional memory cell, because a capacitance ratio is larger for the memory cell of the embodiment compared with the conventional memory cell. For example, for a desired memory cell, writing is performed by respectively setting a voltage applied to the control gate electrode to $V_{CG}=-8V$, voltages applied to the drain regions 110a and 110b to $V_{DD}=3V$, a voltage applied to the P type silicon substrate 101 $V_{SUB}$=open and a voltage applied to the source region 109 $V_{SS}=0V$. Consequently, a threshold voltage for the memory cell is reduced from about 5V to about 2V. Erasing for the memory cell of the embodiment is performed under the same condition for the conventional memory cell.

Figure 23:
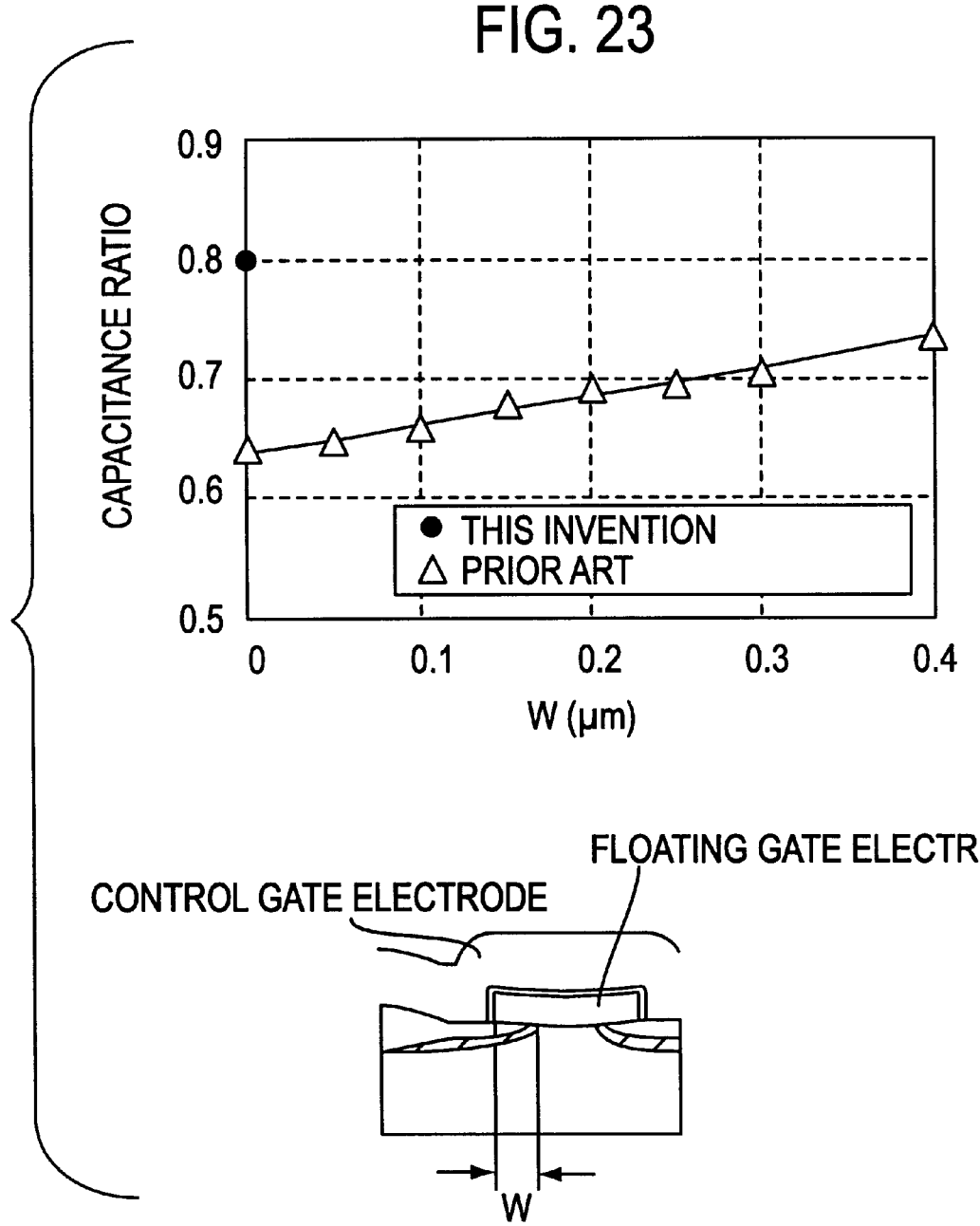
FIG. 23 is a view illustrating an effect of the nonvolatile semiconductor memory device shown in FIG. 15.

Referring to FIG. 23 which illustrates the effect of the nonvolatile semiconductor memory device shown in FIG. 15, there is shown dependence of a capacitance ratio upon a distance from the end part of the drain region 110 to the floating gate electrode 105.

The gate length of the memory cell used for measurement was 0.3 µm and a channel width was 0.3 µm.

In the conventional memory cell, in order to obtain, for instance a capacitance ratio of 0.7, 0.25 μm or more was needed for a distance from the end part of the drain region 110 to the floating gate electrode. By contrast, according to the present invention, as shown in FIG. 23, even if a distance from the end part of the drain region 110 to the floating gate electrode 105 is 0 μm, a capacitance ratio of 0.8 is obtained.

Therefore, a distance from the end part of the drain region 110 to the floating gate electrode 105 can be shortened, and accordingly the present invention is very effective for micro fabrication of a memory cell.

(Second Embodiment)

Figure 24A:
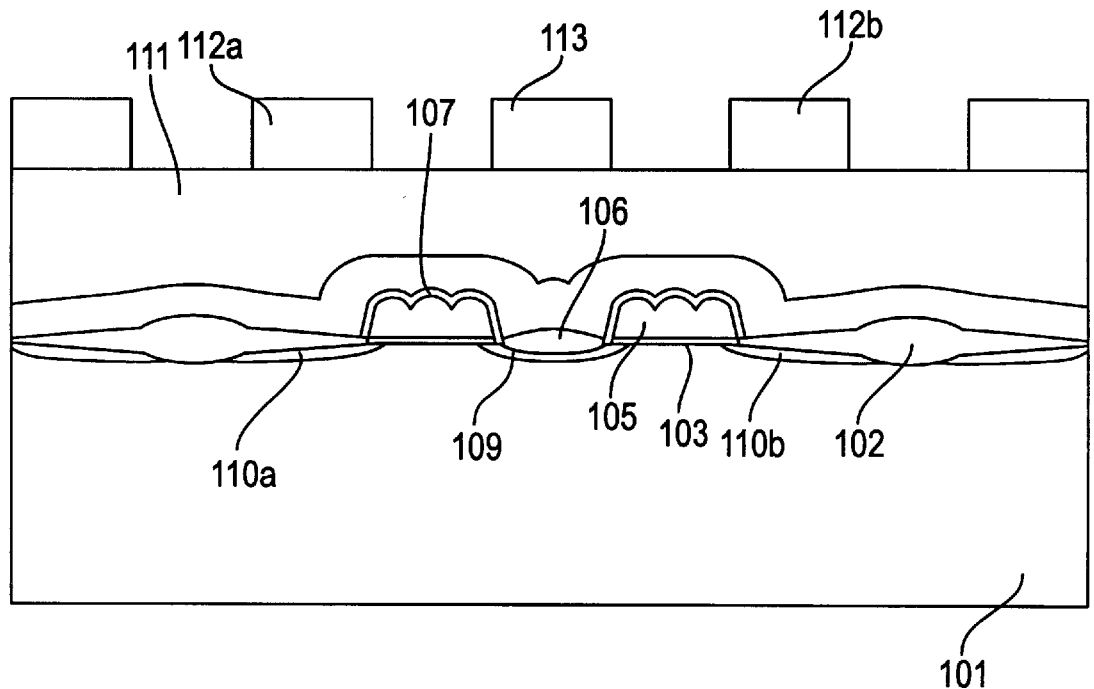
FIG. 24(a) is a section view taken along a line X–X' showing a second embodiment of the nonvolatile semiconductor memory device shown in FIG. 14.
Figure 24B:
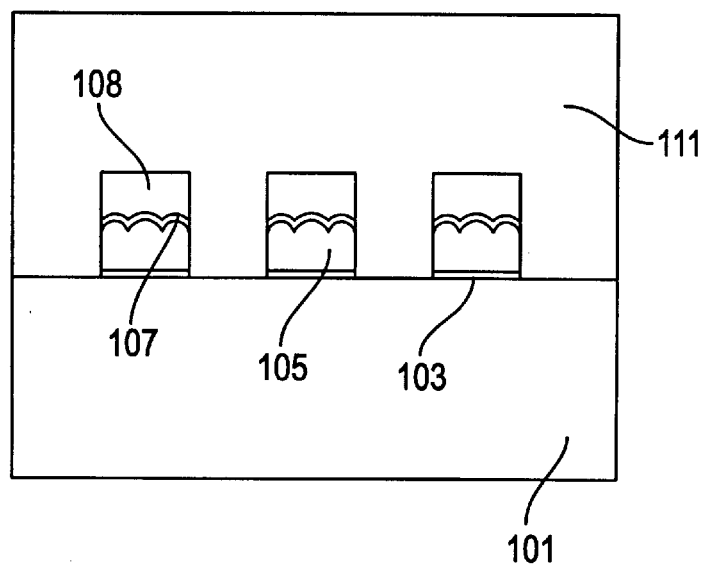
FIG. 24(b) is a section view taken along a line Y–Y' showing the second embodiment of the nonvolatile semiconductor memory device shown in FIG. 14.

FIG. 24(a) is a section view taken along a line X–X' showing the second embodiment of the nonvolatile semiconductor memory device shown in FIG. 14. FIG. 24(b) is a section view taken along a line Y–Y' showing the second embodiment of the nonvolatile semiconductor memory device shown in FIG. 14. FIGS. 25 to 32 are typical section views each illustrating the manufacturing method of the nonvolatile semiconductor memory device shown in FIG. 24. In the embodiment, taper etching is performed for the polycrystalline silicon film 117.

Figure 25:
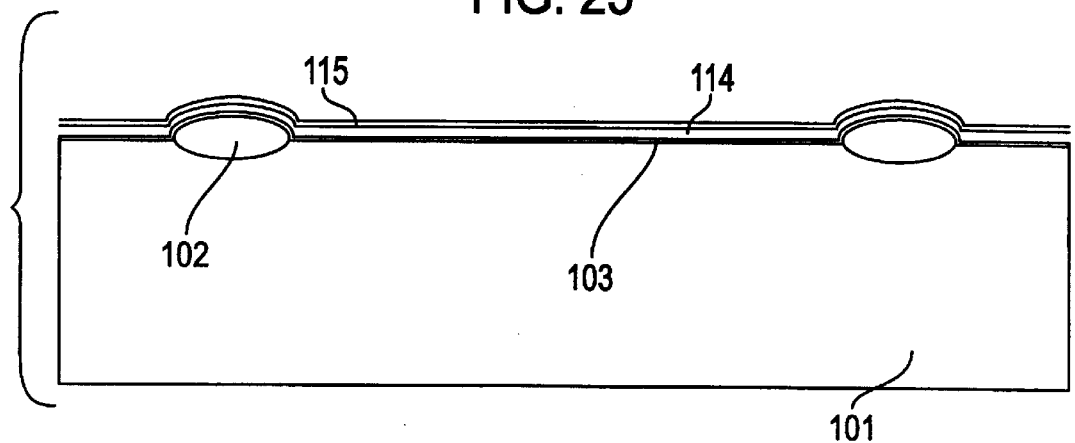
FIG. 25 is a typical section view illustrating a manufacturing method of the nonvolatile semiconductor memory device shown in FIG. 24.

First, a field oxide 102 is formed in the element isolation region of the surface of the P type silicon substrate 101, and a gate oxide film 103 is formed in the element formation region formed in the surface of the P type silicon substrate 101 by thermal oxidation. Thereafter, an N type first polycrystalline silicon film 114 and an amorphous silicon film 115 are formed on the entire surface (FIG. 25).

Then, the amorphous silicon film 115 is irradiated with di-silane, and thereby a nucleus (not shown) is formed on the surface of the amorphous silicon film 115. Thereafter, by performing a high-temperature heat treatment in di-silane atmosphere, a grain is grown around the nucleus. Consequently, the amorphous silicon film 115 is crystallized to be the same as the first polycrystalline silicon film 114, and thereby a polycrystalline silicon film 104 having a projecting and recessing parts in its upper surface. Because of these projecting and recessing parts, the surface area of the upper surface of the first polycrystalline silicon film is increased.

Figure 26:
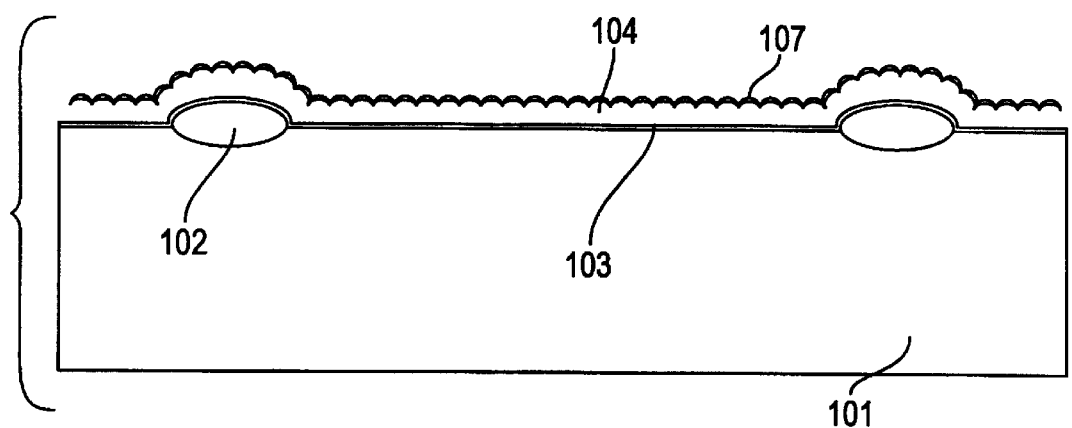
FIG. 26 is a typical section view illustrating the manufacturing method of the nonvolatile semiconductor memory device shown in FIG. 24.

Then, a silicon oxide film (not shown) having a thickness of about 7 nm is formed on the entire surface by a high-temperature vapor growth method, and a silicon nitride film (not shown) is formed also on the entire surface by a vacuum vapor growth method (LPCVD). Thereafter, by forming a silicon oxide film (nos shown) having a thickness of about 2 nm by the high-temperature vapor growth method, a gate insulating film 107 having a total thickness of about 12.5 nm is formed on the entire surface (FIG. 26).

Figure 27:
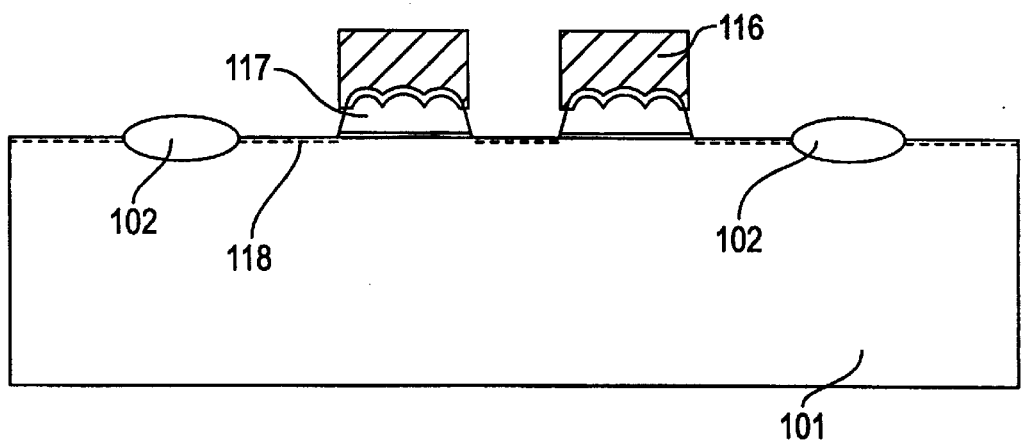
FIG. 27 is a typical section view illustrating the manufacturing method of the nonvolatile semiconductor memory device shown in FIG. 24.

Then, the gate insulating film 107 and the first polycrystalline silicon film 114 are patterned by a photoresist film pattern 116 so as to form a polycrystalline silicon film pattern 117, which is linear in parallel with a bit line. At this time, etching is performed such that the shape of the polycrystalline silicon film pattern 117 is tapered. Subsequently, by implanting arsenic ions of 5×15 cm$^{-2}$ at 70 KeV approximately in parallel with a normal to the surface of the P type silicon substrate 101, a first arsenic ion implanted layer 118 is formed (FIG. 27).

Figure 28:
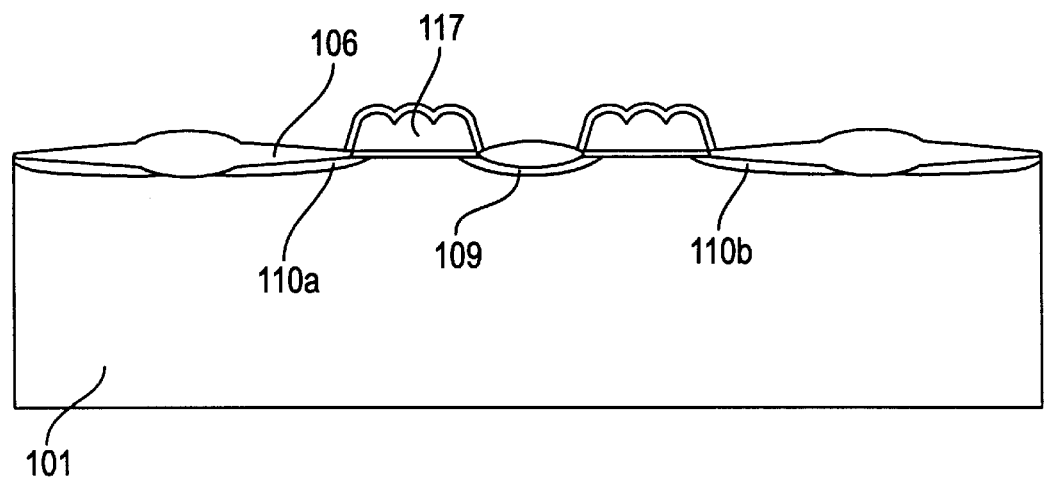
FIG. 28 is a typical section view illustrating the manufacturing method of the nonvolatile semiconductor memory device shown in FIG. 24.

Then, the photoresist film pattern 116 is eliminated, and thereafter a heat treatment is performed in nitrogen atmosphere of 850° C. for about 30 minutes. By this heat treatment, the first arsenic ion implanted layer 118 is activated, and a source drain 109 and drain regions 110a and 110b are formed. Thereafter, by a thermal oxidizing method, the surfaces of the P type silicon film substrate and the polycrystalline silicon film pattern 117 are oxidized, and an oxide film 106 having a thickness of about 100 nm is formed on the surface of the P type silicon substrate 101 on the first arsenic ion implanted layer 118 (FIG. 28).

Figure 29:
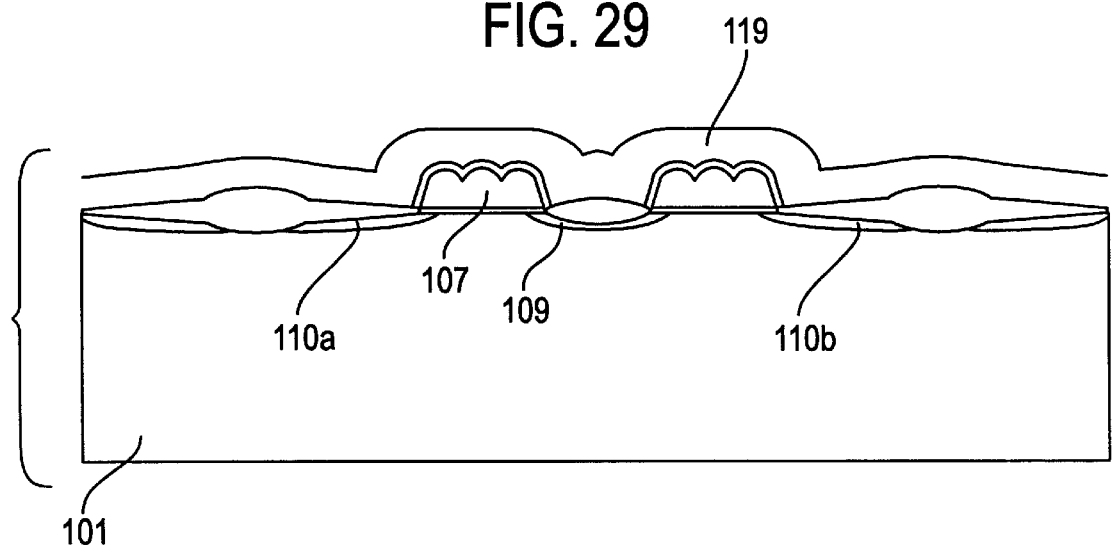
FIG. 29 is a typical section view illustrating the manufacturing method of the nonvolatile semiconductor memory device shown in FIG. 24.

Then, an N+ type second polycrystalline silicon film 119 is formed on the entire surface (FIG. 29).

Figure 30:
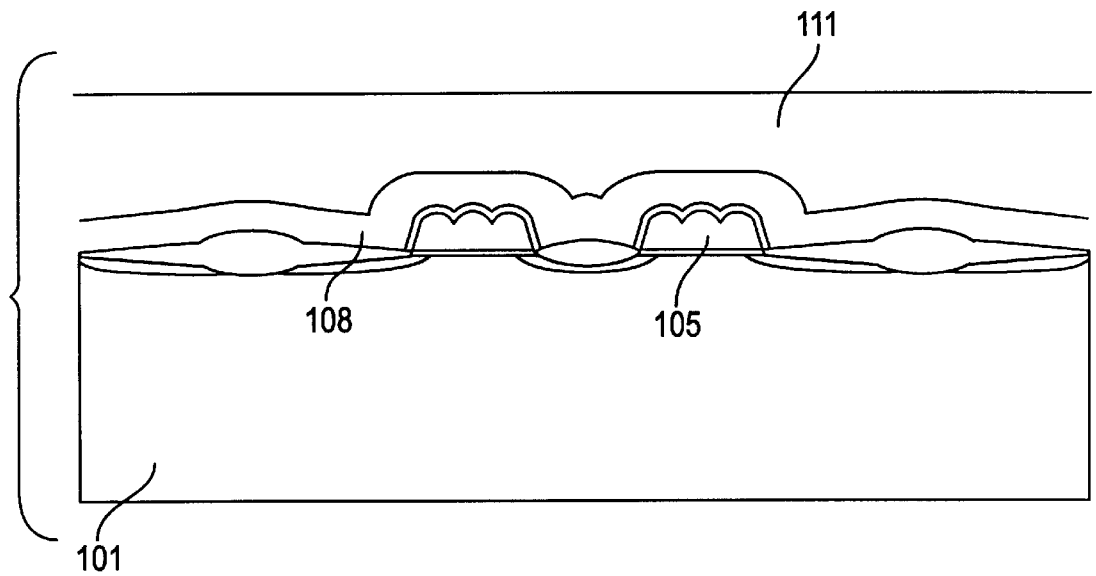
FIG. 30 is a typical section view illustrating the manufacturing method of the nonvolatile semiconductor memory device shown in FIG. 24.

Then, patterning is performed for the second polycrystalline silicon film 119, the gate insulating film 106 and the polycrystalline silicon film pattern 117 in sequence, and thereby a control gate electrode 108 composed of the second polycrystalline silicon film 119 and a floating gate electrode 105 composed of the polycrystalline silicon film pattern 117 are formed. An interlayer insulating film 111 composed of a BPSG film having a thickness of about 0.8 μm is then formed on the entire surface (FIG. 30).

Figure 31:
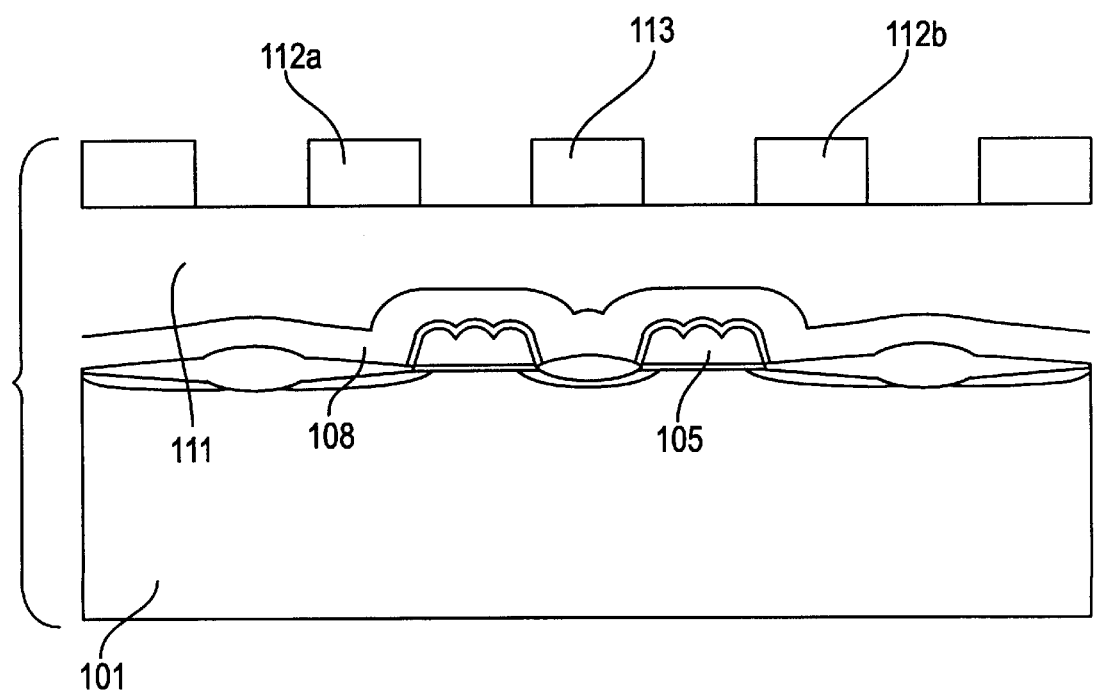
FIG. 31 is a typical section view illustrating the manufacturing method of the nonvolatile semiconductor memory device shown in FIG. 24.

Then, contact holes (not shown) which reach the drain regions 110a and 110b and the source region 109 are formed in the interlayer insulating film 111, and subsequently an aluminum metallic film having a thickness of about 0.45 μm is formed on the entire surface. By patterning this metallic film, bit lines 112a and 112b and a source line 113 are formed (FIG. 31).

(Third Embodiment)

Figure 32A:
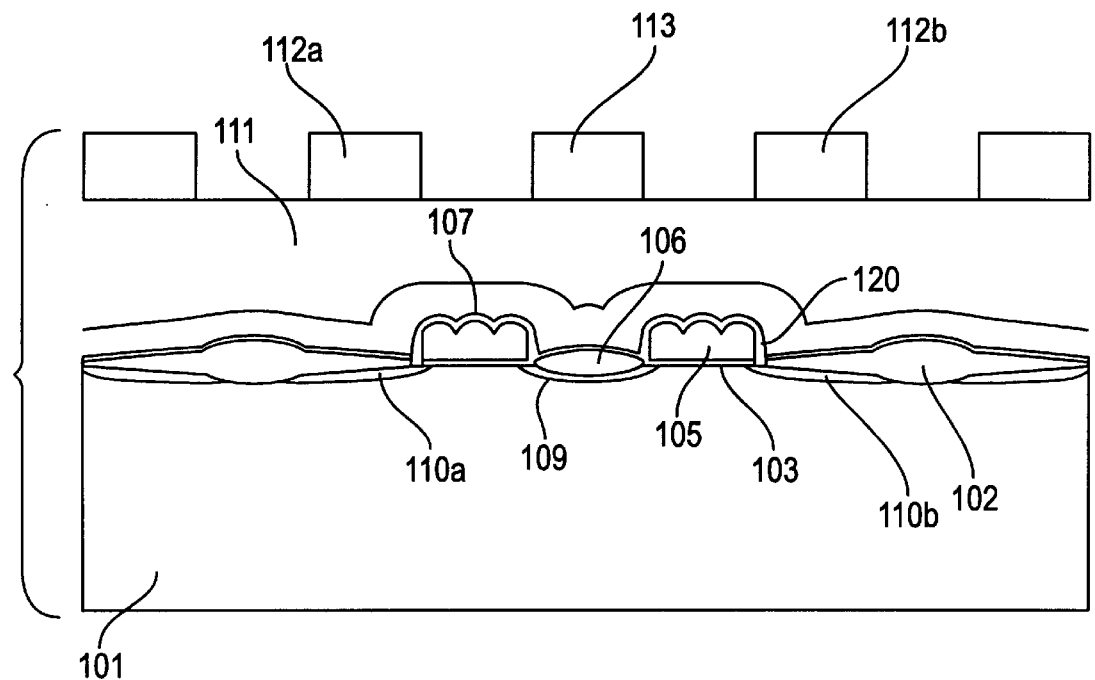
FIG. 32(a) is a section view taken along a line X–X' showing a third embodiment of the nonvolatile semiconductor memory device shown in FIG. 14.
Figure 32B:
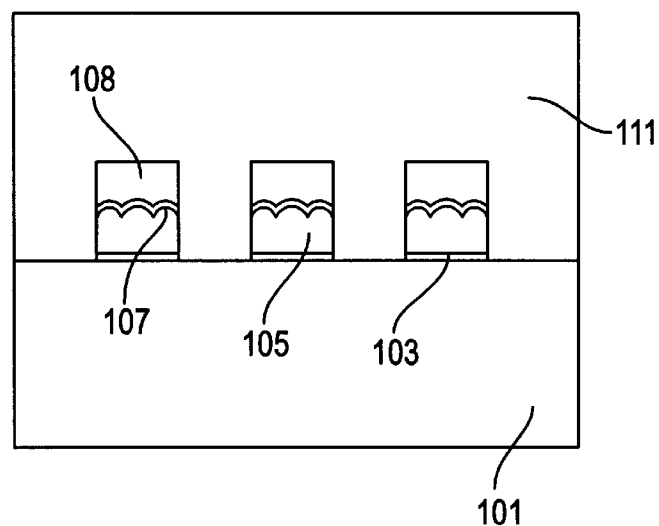
FIG. 32(b) is a section view taken along a line Y–Y' showing the third embodiment of the nonvolatile semiconductor memory device shown in FIG. 14.

FIG. 32(a) is a section view taken along a line X–X' showing the third embodiment of the nonvolatile semiconductor memory device shown in FIG. 14. FIG. 32(b) is a section view taken along a line Y–Y' showing the third embodiment of the nonvolatile semiconductor memory device shown in FIG. 14. FIGS. 33 to 42 are typical section views each illustrating the manufacturing method of the nonvolatile semiconductor memory device shown in FIG. 32. In the embodiment, a side wall oxide film 120 is provided in the side part of the polycrystalline silicon film pattern 117.

Figure 33:
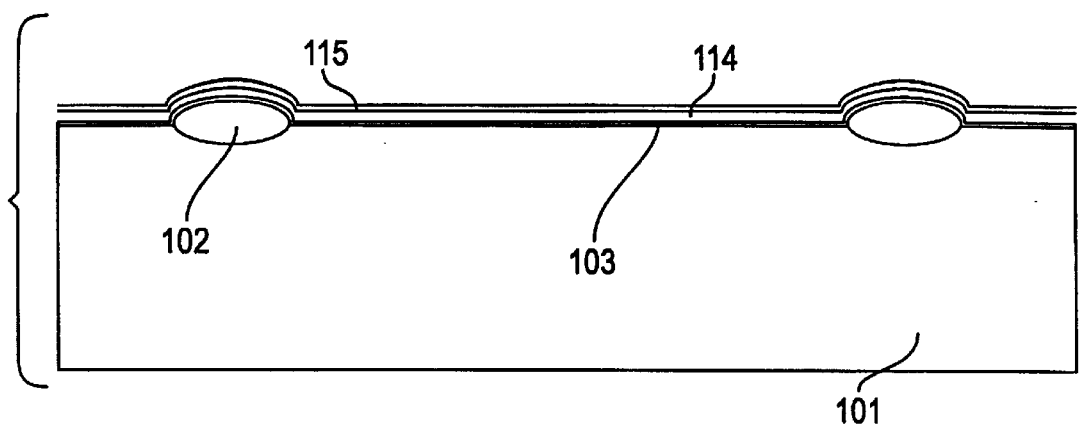
FIG. 33 is a typical section view illustrating a manufacturing method of the nonvolatile semiconductor memory device shown in FIG. 32.

First, a field oxide 102 is formed in the element isolation region of the surface of the P type silicon substrate 101, and a gate oxide film 103 is formed in the element formation region in the surface of the P type silicon substrate 101 by thermal oxidation. Thereafter, an N type first polycrystalline silicon film 114 and an amorphous silicon film 115 are formed on the entire surface (FIG. 33).

Figure 34:
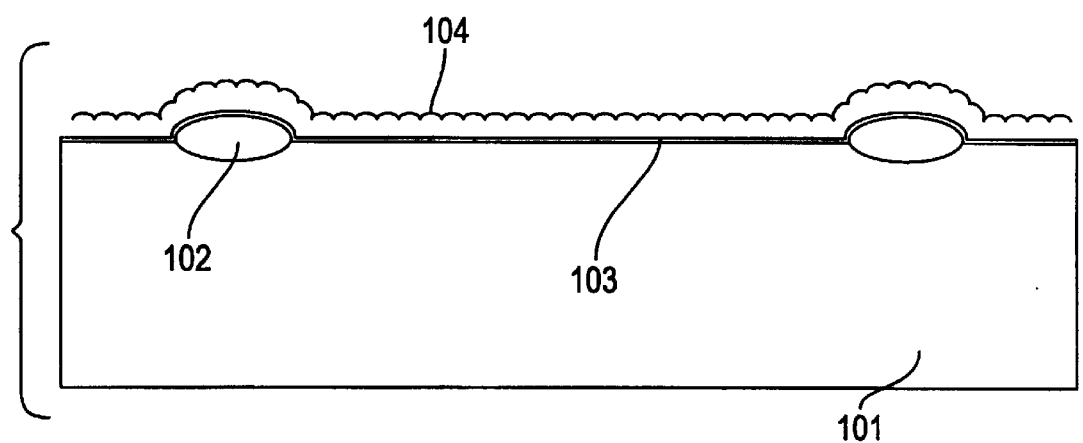
FIG. 34 is a typical section view illustrating the manufacturing method of the nonvolatile semiconductor memory device shown in FIG. 32.

Then, the amorphous silicon film 115 is irradiated with di-silane, and thereby a nucleus (not shown) is formed on the surface of the amorphous silicon film 115. Thereafter, by performing a high-temperature heat treatment in di-silane atmosphere, grains are grown around the nucleus. Consequently, the amorphous silicon film 115 is crystallized to be the same as the first polycrystalline silicon film 114, and a polycrystalline silicon film 104 having projecting and recessing parts in its upper surface is formed. Because of these projecting and recessing parts, the surface area of the upper surface of the first polycrystalline silicon film is increased (FIG. 34).

Figure 35:
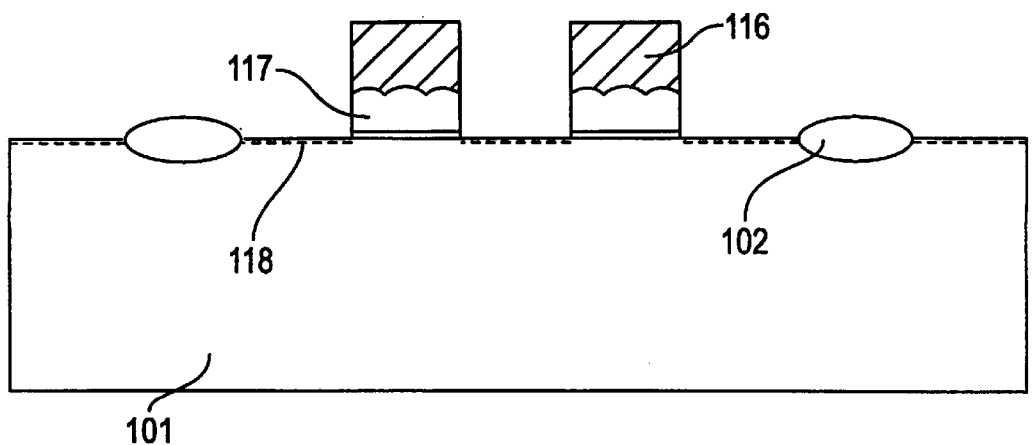
FIG. 35 is a typical section view illustrating the manufacturing method of the nonvolatile semiconductor memory device shown in FIG. 32.

Then, by using a photoresist film pattern 116, the first polycrystalline silicon film 114 is patterned so as to form a polycrystalline silicon film pattern 117, which is linear in parallel with a bit line. At this time, etching is performed such that the shape of the polycrystalline silicon film pattern 117 is tapered. Subsequently, arsenic ions of 5×15 cm$^{-2}$ are implanted at 70 KeV approximately in parallel with a normal to the surface of the P type silicon substrate 101, and thereby a first arsenic ion implanted layer 118 is formed (FIG. 35).

Then, a deposited oxide film 121 having a thickness of 150 nm is grown on the entire surface, and subsequently a heat treatment is performed in nitrogen atmosphere of 850°

Figure 36:
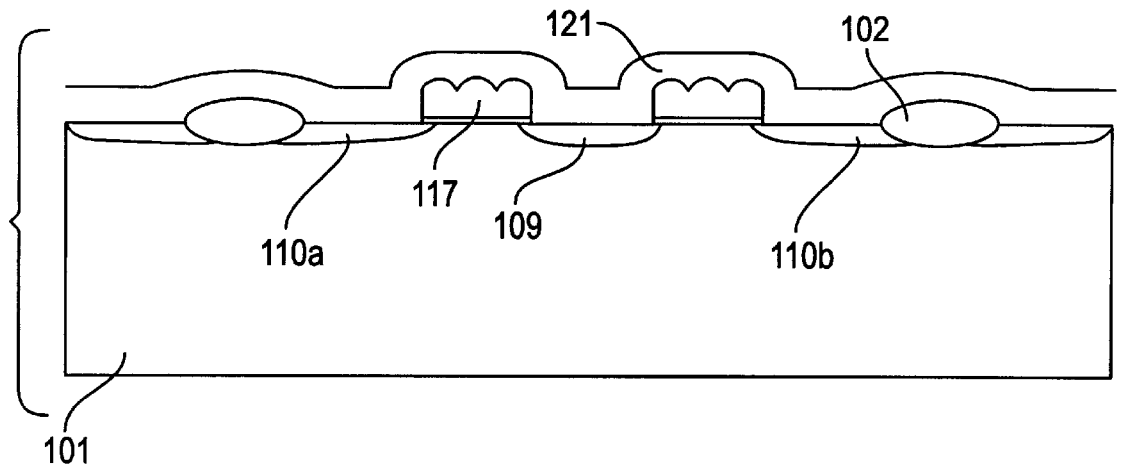
FIG. 36 is a typical section view illustrating the manufacturing method of the nonvolatile semiconductor memory device shown in FIG. 32.

C. for about 30 minutes. By this heat treatment, the first arsenic ion implanted layer 118 is activated, and a source region 109 and drain regions 110a and 110b are formed (FIG. 36).

Figure 37:
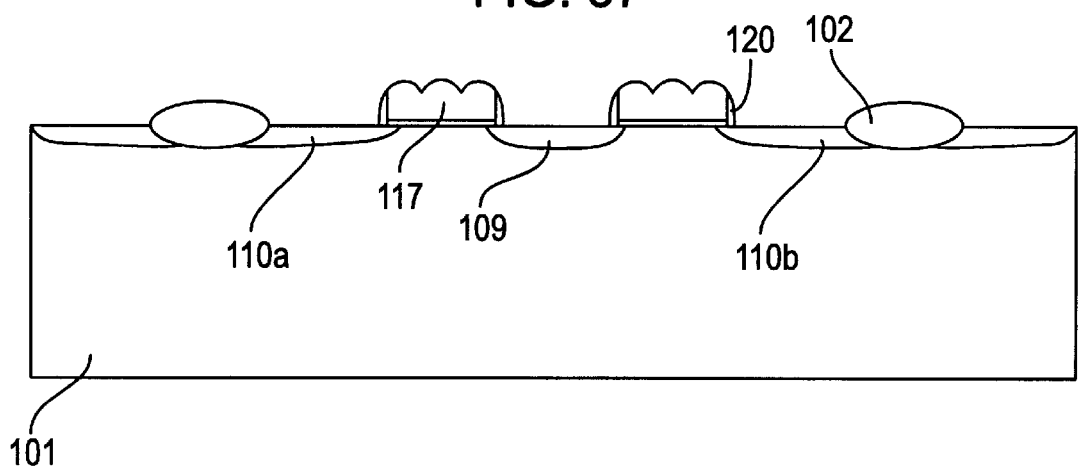
FIG. 37 is a typical section view illustrating the manufacturing method of the nonvolatile semiconductor memory device shown in FIG. 32.

Then, anisotropic etching is performed on the entire surface. Consequently, a side wall oxide film 120 is formed on the side part of the polycrystalline silicon film pattern 117 (FIG. 37).

Figure 38:
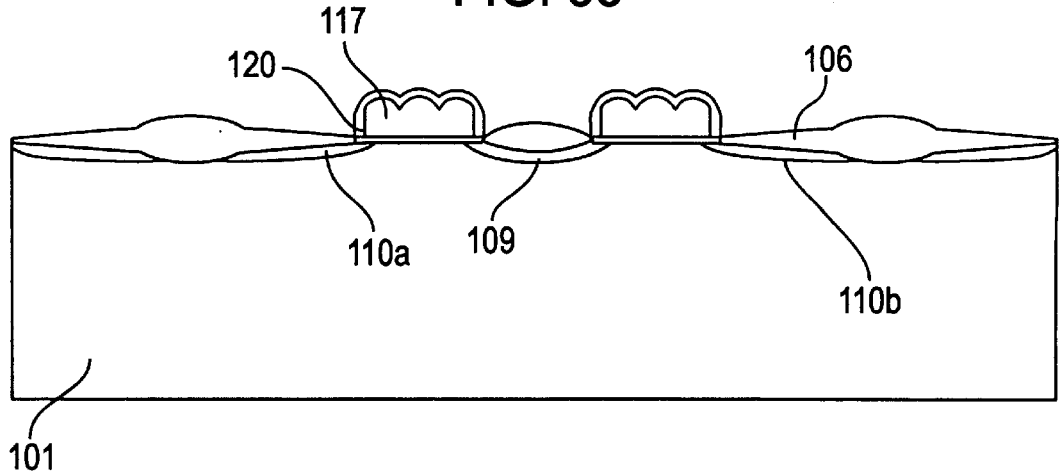
FIG. 38 is a typical section view illustrating the manufacturing method of the nonvolatile semiconductor memory device shown in FIG. 32.

Then, the surfaces of the P type silicon substrate 101 and the polycrystalline silicon film pattern 117 are oxidized by a thermal oxidizing method, and thereby an oxide film 106 having a thickness of about 100 nm is formed on the surface of the P type silicon substrate 101 on the drain regions 110a and 110b and the source region 109 (FIG. 38).

Figure 39:
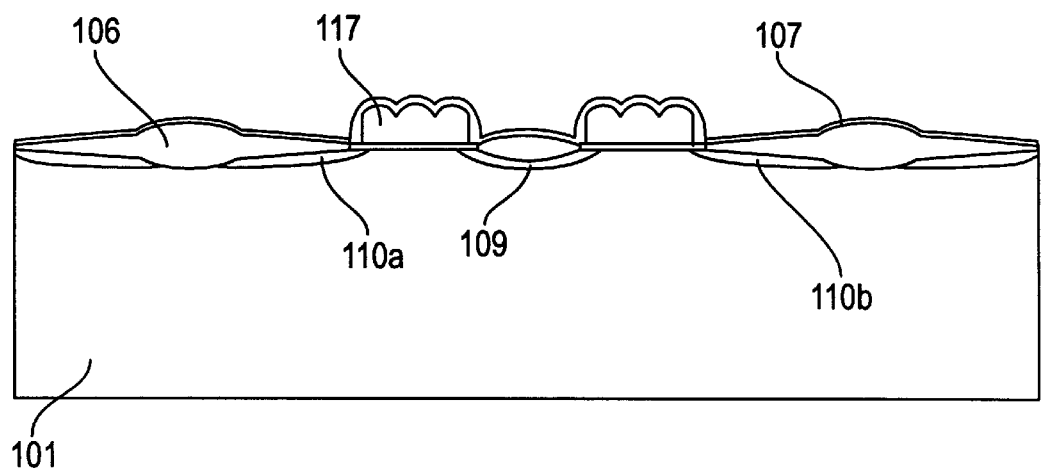
FIG. 39 is a typical section view illustrating the manufacturing method of the nonvolatile semiconductor memory device shown in FIG. 32.

Then, a silicon oxide film (not shown) having a thickness of about 7 nm is formed on the entire surface by a high-temperature vapor growth method, and a silicon nitride film (not shown) is formed also on the entire surface by a vacuum vapor growth method (LPCVD). Thereafter, by forming a silicon oxide film (not shown) having a thickness of about 2 nm by the high-temperature vapor growth method, a gate insulating film 107 having a total thickness of about 12.5 nm is formed on the entire surface (FIG. 39).

Figure 40:
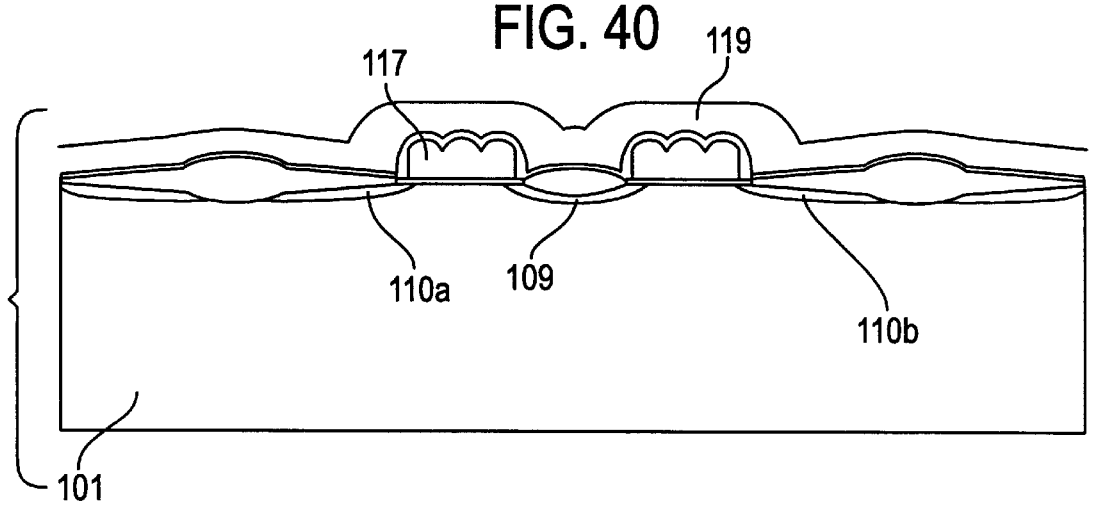
FIG. 40 is a typical section view illustrating the manufacturing method of the nonvolatile semiconductor memory device shown in FIG. 32.

Then, an N+ type second polycrystalline silicon film 119 is formed on the entire surface (FIG. 40).

Figure 41:
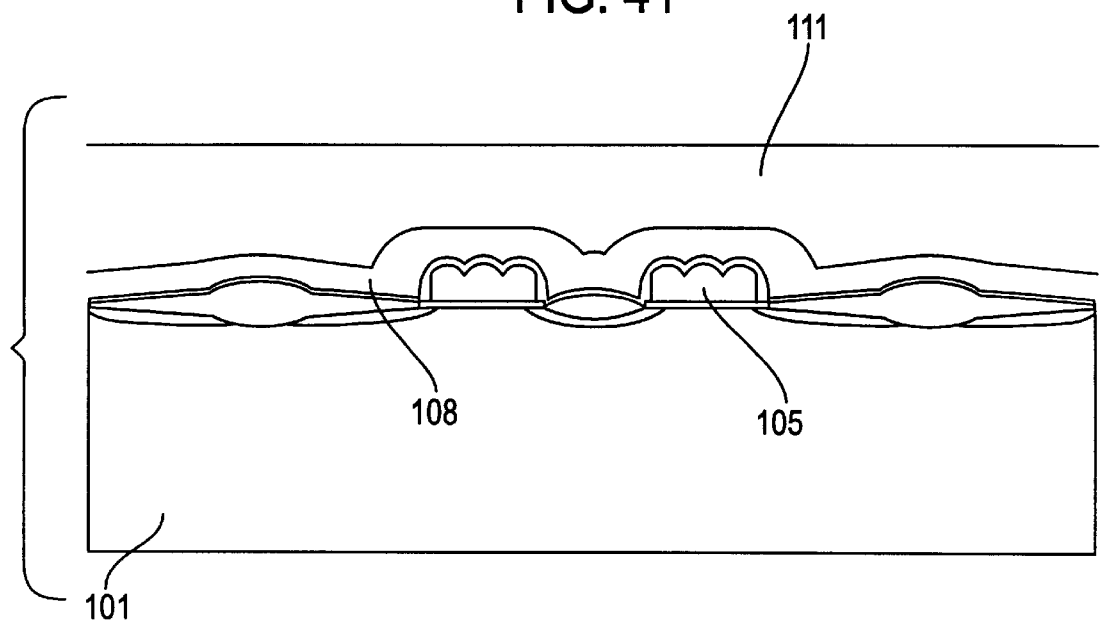
FIG. 41 is a typical section view illustrating the manufacturing method of the nonvolatile semiconductor memory device shown in FIG. 32.

Then, by performing patterning for the second polycrystalline silicon film 119, the gate insulating film 107 and the polycrystalline silicon film pattern 117 in sequence, a control gate electrode 108 composed of the second polycrystalline silicon film 119 and a floating gate electrode 105 composed of the polycrystalline silicon film pattern 117 are formed. Thereafter, an interlayer insulating film 111 composed of a BPSG film of a thickness of about 0.8 μm is formed on the entire surface (FIG. 41).

Figure 42:
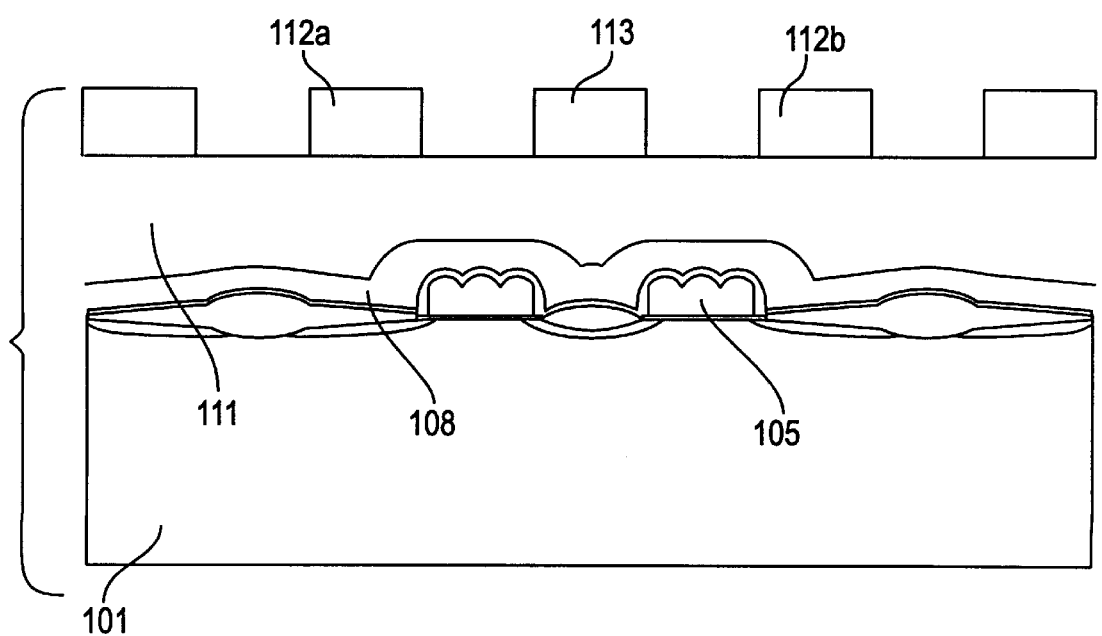
FIG. 42 is a typical section view illustrating the manufacturing method of the nonvolatile semiconductor memory device shown in FIG. 32.

Then, contact holes 124 which reach the drain regions 110a and 110b and the source region 109, and so on, are formed in the interlayer insulating film 111. Thereafter, an aluminum metallic film having a thickness of about 0.45 μm is formed on the entire surface, and by patterning this metallic film, bit lines 112a and 112b and a source line 113 are formed (FIG. 42).

(Fourth Embodiment)

Figure 43A:
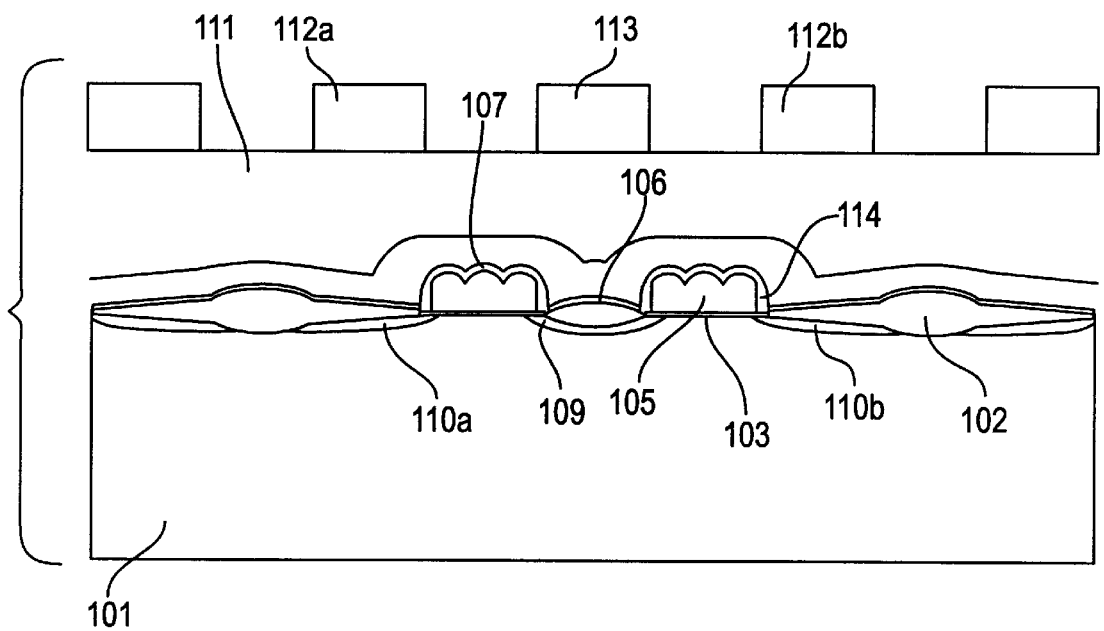
FIG. 43(a) is a section view taken along a line X–X' showing a fourth embodiment of the nonvolatile semiconductor memory device shown in FIG. 14.
Figure 43B:
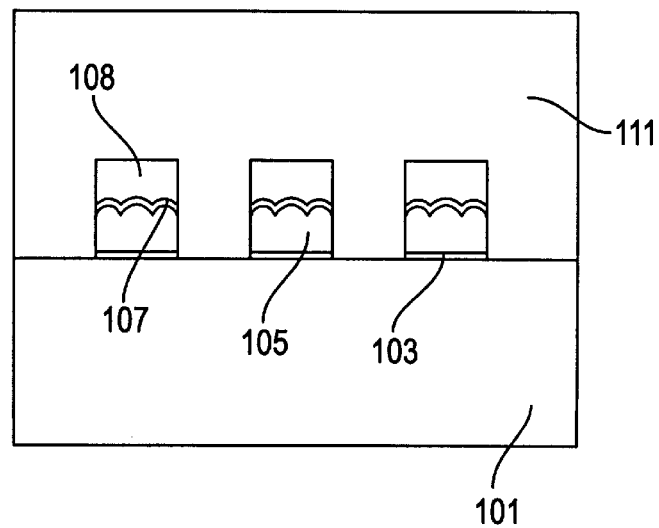
FIG. 43(b) is a section view taken along a line Y–Y' showing the fourth embodiment of the nonvolatile semiconductor memory device shown in FIG. 14.

FIG. 43(a) is a section view taken along a line X–X' showing the fourth embodiment of the nonvolatile semiconductor memory device shown in FIG. 14. FIG. 43(b) is a section view taken along a line Y–Y' showing the fourth embodiment of the nonvolatile semiconductor memory device shown in FIG. 14. FIGS. 44 to 54 are typical section views each illustrating the manufacturing method of the nonvolatile semiconductor memory device shown in FIG. 43. In the embodiment, a side wall oxide film 120 is formed on the side part of the polycrystalline silicon film pattern 117, and a source region 109 and drain regions 110a and 110b are formed in steps different from the steps described above.

Figure 44:
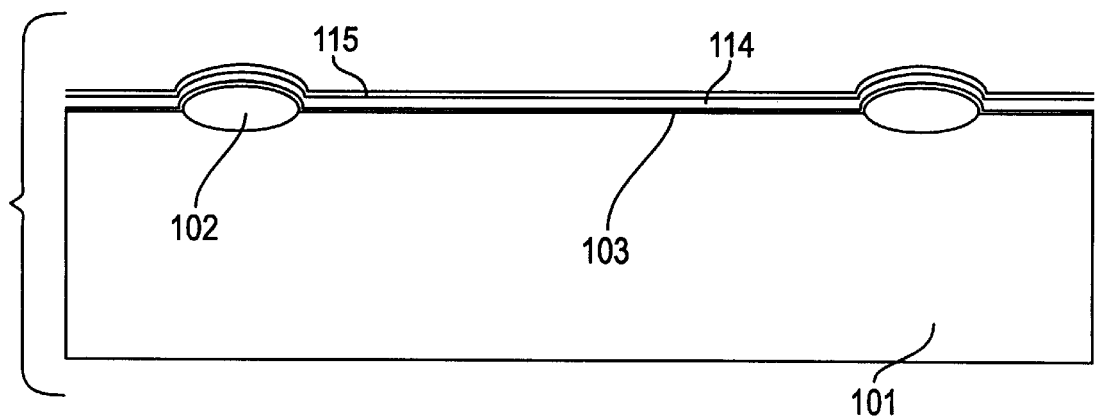
FIG. 44 is a typical section view illustrating a manufacturing method of the nonvolatile semiconductor memory device shown in FIG. 43.

First, a field oxide 102 is formed in the element isolation region in the surface of the P type silicon substrate 101, and a gate oxide film 103 is formed in the element formation region of the surface of the P type silicon substrate 101 by thermal oxidation. Thereafter, an N type first polycrystalline silicon film 114 and an amorphous silicon film 115 are formed on the entire surface (FIG. 44).

Figure 45:
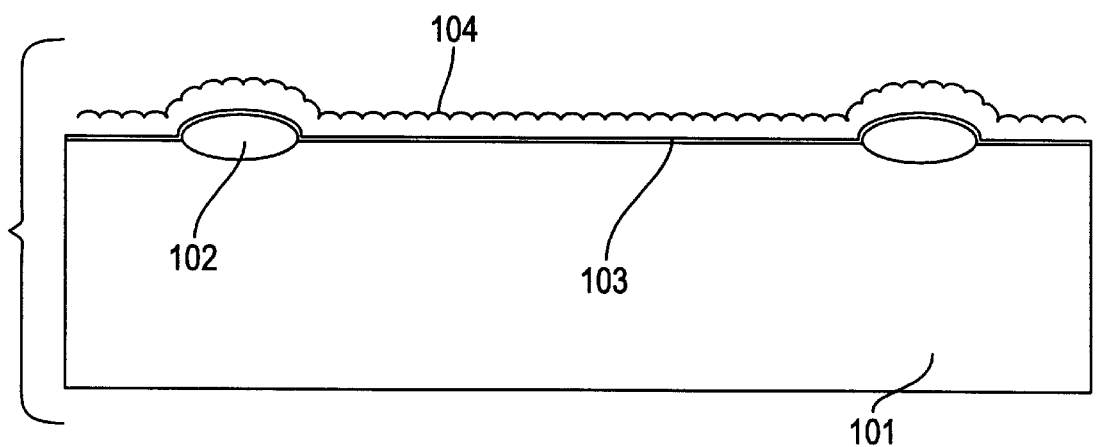
FIG. 45 is a typical section view illustrating the manufacturing method of the nonvolatile semiconductor memory device shown in FIG. 43.

Then, the amorphous silicon film 115 is irradiated with di-silane, and thereby a nucleus (not shown) is formed on the surface of the amorphous silicon film 115. Thereafter, by performing a high-temperature heat treatment in di-silane atmosphere, grains are grown around the nucleus. Consequently, the amorphous silicon film 115 is crystallized to be the same as the first polycrystalline silicon film 114, and a polycrystalline silicon film 104 having projecting and recessing parts is formed. Because of these projecting and recessing parts, the surface area of the upper surface of the first polycrystalline silicon film is increased (FIG. 45).

Figure 46:
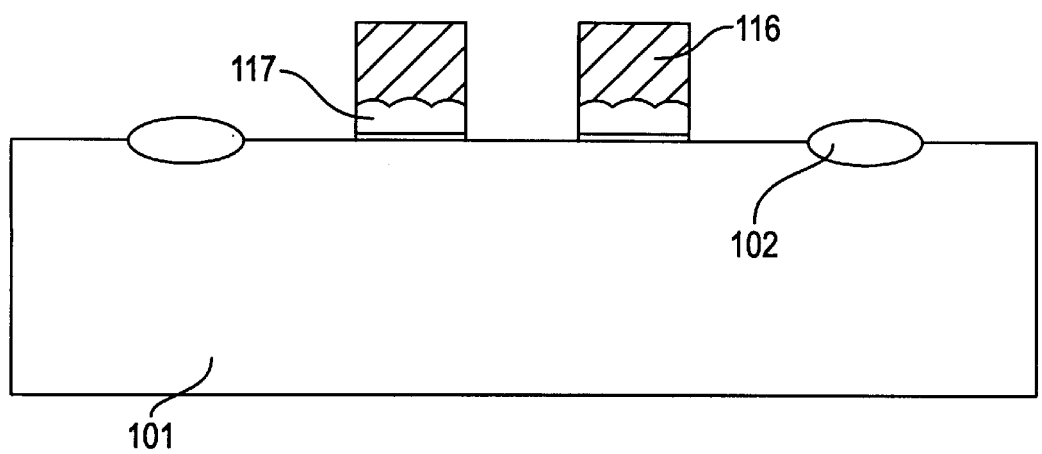
FIG. 46 is a typical section view illustrating the manufacturing method of the nonvolatile semiconductor memory device shown in FIG. 43.

Then, by a first photoresist film pattern 116, the first polycrystalline silicon film 114 is patterned so as to form a polycrystalline silicon film pattern 117, which is linear in parallel with a bit line (FIG. 46).

Figure 47:
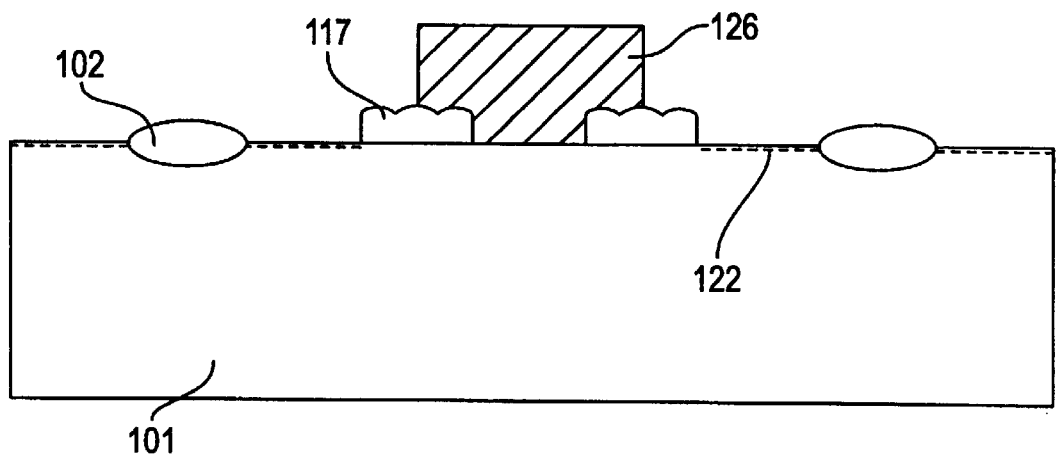
FIG. 47 is a typical section view illustrating the manufacturing method of the nonvolatile semiconductor memory device shown in FIG. 43.

Then, a second photoresist film pattern 126 is formed in a region other than one in which a drain is to be formed, and by implanting arsenic ions of 5×15 cm$^{-2}$ at 70 KeV as first implanting energy approximately in parallel with a normal to the surface of the P type silicon substrate 101 with the photoresist film pattern 126 used as a mask, a second arsenic ion implanted layer 112 is formed in the P type silicon substrate 101 (FIG. 47).

Figure 48:
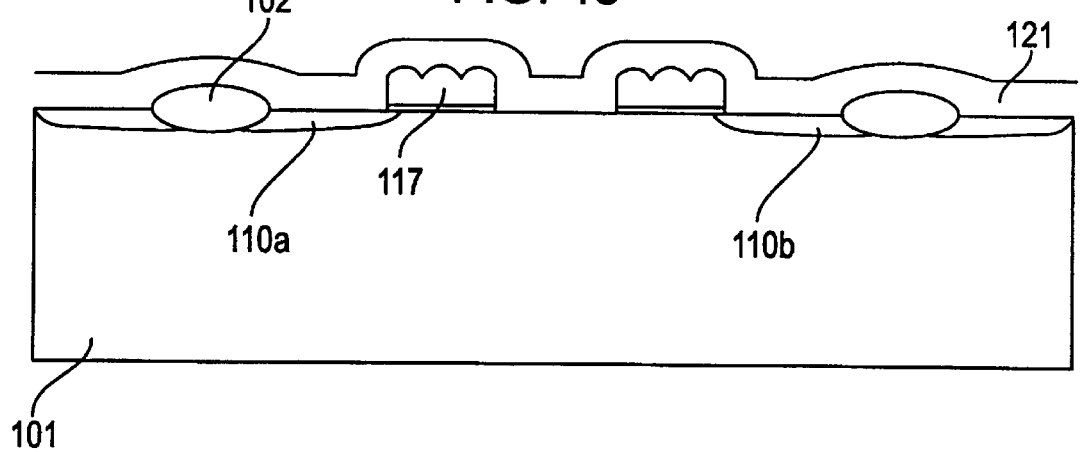
FIG. 48 is a typical section view illustrating the manufacturing method of the nonvolatile semiconductor memory device shown in FIG. 43.

Then, a deposited oxide film 121 having a thickness of about 150 nm is grown on the entire surface. Subsequently, a first heat treatment is performed in nitrogen atmosphere of 850° C. for about 30 minutes. By this heat treatment, the second arsenic ion implanted layer 122 is activated and drain regions 110a and 110b are formed (FIG. 48).

Figure 49:
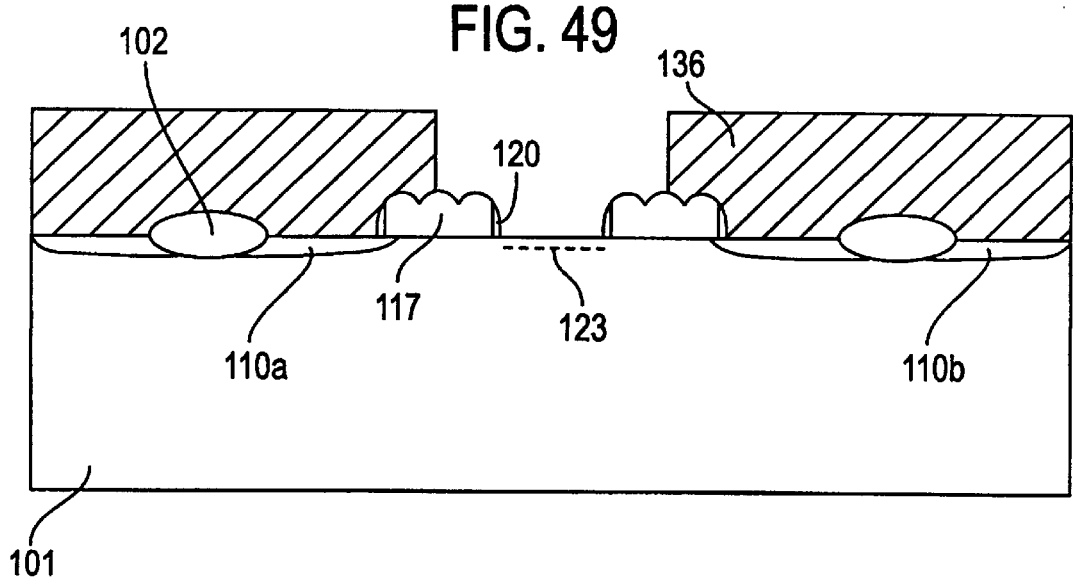
FIG. 49 is a typical section view illustrating the manufacturing method of the nonvolatile semiconductor memory device shown in FIG. 43.

Then, anisotropic etching is performed on the entire surface. Consequently, a side wall oxide film 120 is formed on the side part of the polycrystalline silicon film pattern 117. Subsequently, a third photoresist film pattern 136 is formed in a region other than one in which a source is to be formed. Thereafter, by implanting arsenic ions of 3×10$^{15}$ cm$^{-2}$ at 40 KeV as second implanting energy approximately in parallel with a normal to the surface of the P type silicon substrate 101 using the photoresist film pattern 136 as a mask, a third arsenic ion implanted layer 123 is formed in the P type silicon substrate 101 (FIG. 49).

Figure 50:
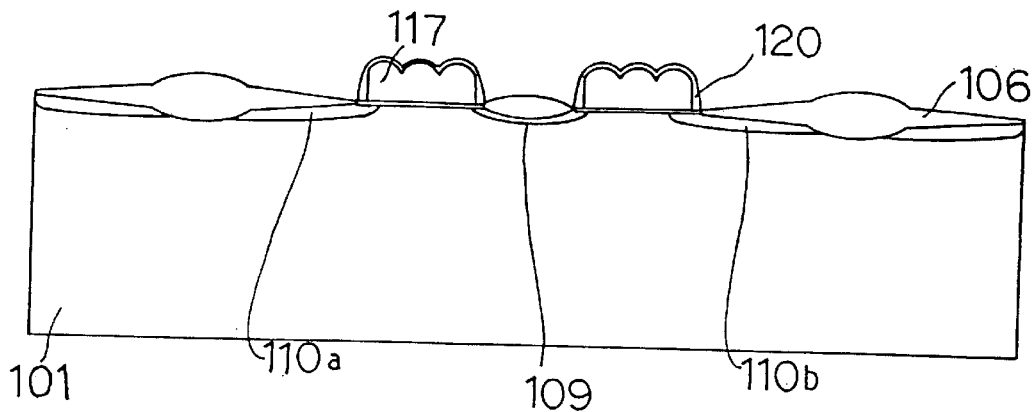
FIG. 50 is a typical section view illustrating the manufacturing method of the nonvolatile semiconductor memory device shown in FIG. 43.

Then, the surfaces of the P type silicon substrate 101 and the polycrystalline silicon film pattern 117 are oxidized by a thermal oxidizing method, and an oxide film 106 having a thickness of about 100 nm is formed on the surface of the P type silicon substrate 101 on the second and third arsenic ion implanted layers 122 and 123. Simultaneously, the third arsenic ion implanted layer 123 is activated, and thereby a source region 109 is formed (FIG. 50).

Figure 51:
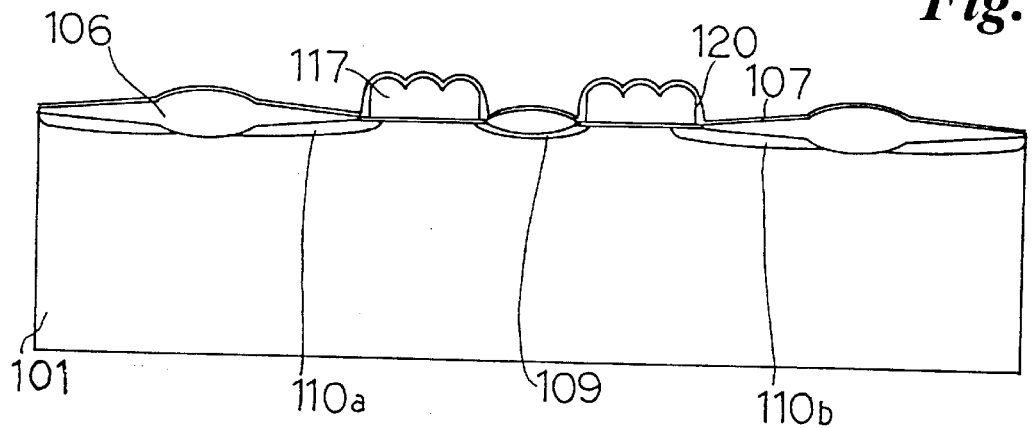
FIG. 51 is a typical section view illustrating the manufacturing method of the nonvolatile semiconductor memory device shown in FIG. 43.

Then, an silicon oxide film (not shown) having a thickness of about 7 nm is formed on the entire surface by a high-temperature vapor growth method and a silicon nitride film (not shown) is formed also on the entire surface by a vacuum vapor growth method (LPCVD). Thereafter, by forming a silicon oxide film (not shown) having a thickness of about 2 nm is formed by the high-temperature vapor growth method, a gate insulating film 107 having a total thickness of about 12.5 nm is formed on the entire surface (FIG. 51).

Figure 52:
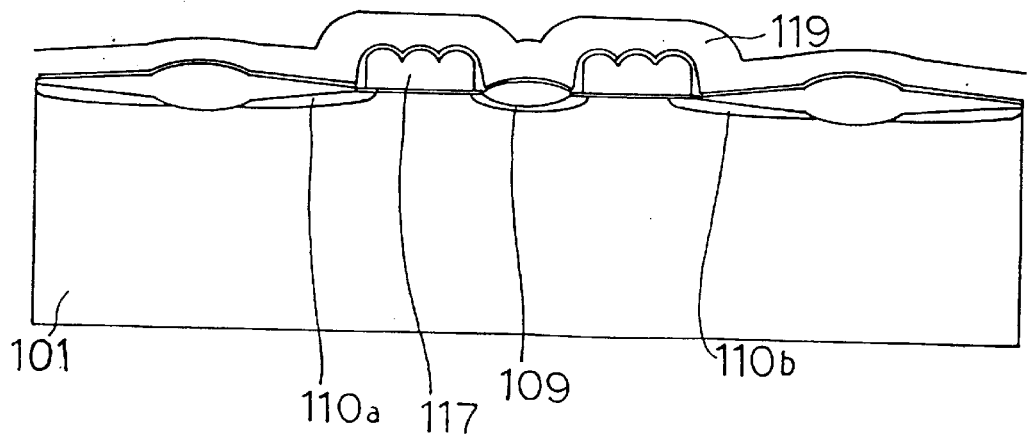
FIG. 52 is a typical section view illustrating the manufacturing method of the nonvolatile semiconductor memory device shown in FIG. 43.

Then, an N+ type second polycrystalline film 119 is formed on the entire surface (FIG. 52).

Figure 53:
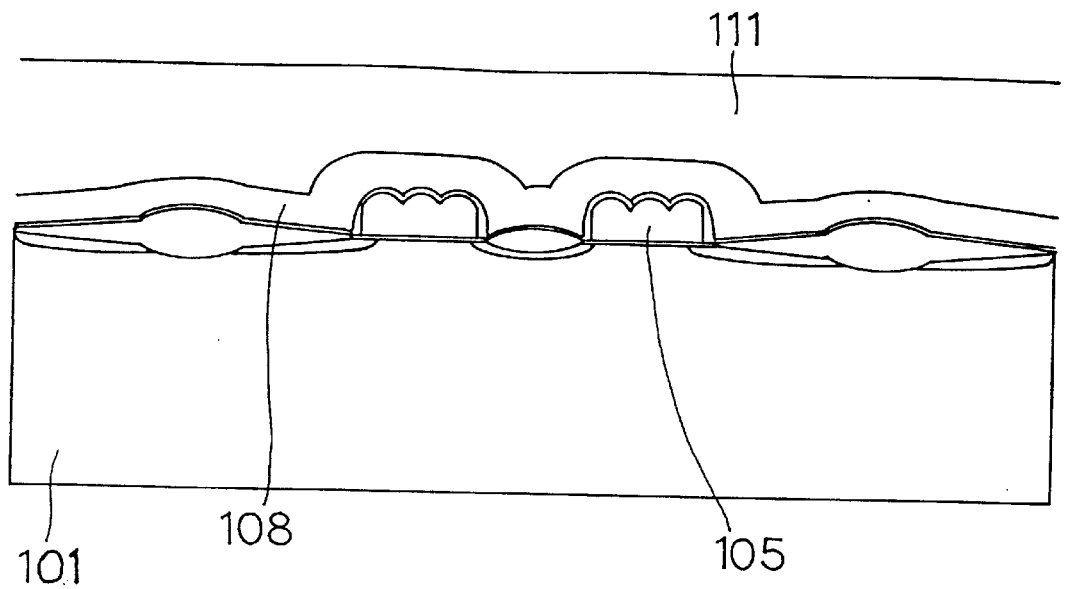
FIG. 53 is a typical section view illustrating the manufacturing method of the nonvolatile semiconductor memory device shown in FIG. 43.

Then, the N+ type second polycrystalline silicon film 119, the gate insulating film 107 and the polycrystalline silicon film pattern 117 are patterned in sequence, and thereby a control gate electrode 108 composed of the second polycrystalline silicon film 119 and a floating gate electrode 105 composed of the polycrystalline silicon film pattern 117 are formed. Thereafter, an interlayer insulating film 111 composed of a BPSG film having a thickness of about 0.8 μm is formed on the entire surface (FIG. 53).

Figure 54:
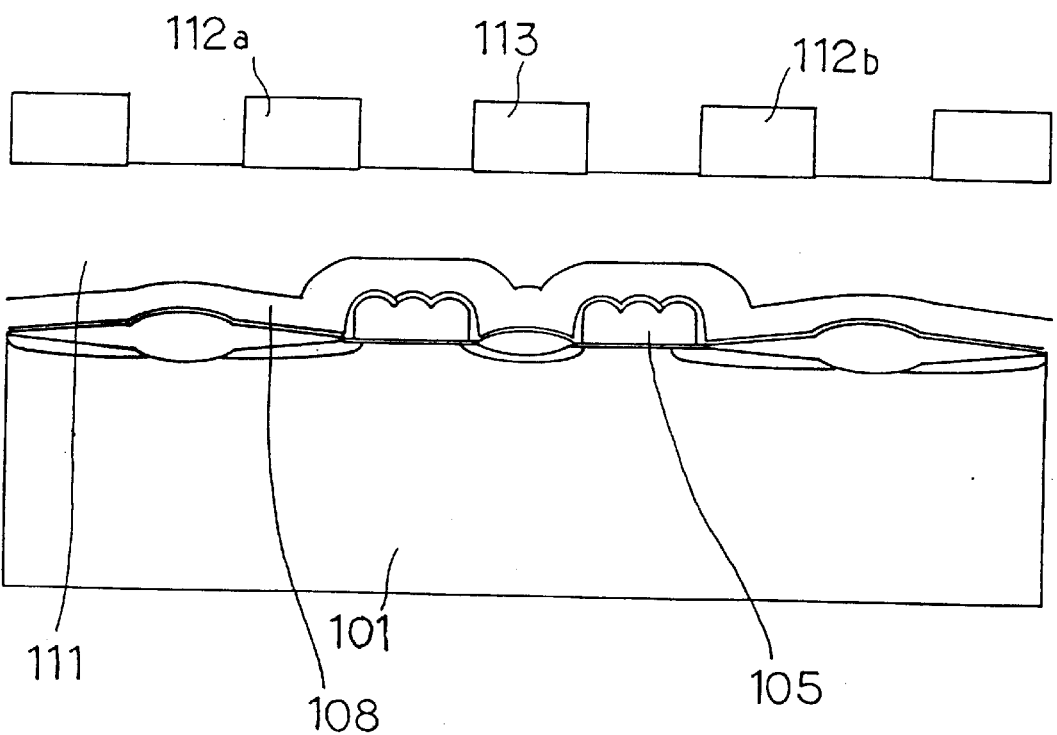
FIG. 54 is a typical section view illustrating the manufacturing method of the nonvolatile semiconductor memory device shown in FIG. 43.

Then, contact holes (not shown) which reach the drain regions 110a and 110b and the source region 109, and so on, are formed in the interlayer insulating film 111. Thereafter, an aluminum metallic film having a thickness of about 0.45 μm is formed on the entire surface, and by patterning this metallic film, bit lines 112a and 112b and a source line 113 are formed (FIG. 54).

The effects of the nonvolatile semiconductor memory device of the present invention constructed in the manner described above are summarized as follows.

(1) Because of the polycrystalline silicon film having projecting and recessing parts in the upper surface of the floating gate electrode, the upper surface effective area of the floating gate electrode is increased. Accordingly, a capacitance between the floating gate electrode and the control gate electrode is increased, drain and source regions can be formed in self alignment with the polycrystalline silicon film pattern rather than with the nitride film pattern, which was the case for the conventional memory cell, and the memory cell structure for obtaining a high capacitance ratio proper for a low power supply voltage can be provided by the smaller number of manufacturing steps compared with the conventional method.

(2) Since taper etching is performed for the polycrystalline silicon film pattern, the area of the side part of the floating gate electrode is increased and thus a higher capacitance ratio can be obtained.

(3) Since the side wall oxide film is formed in the side part of the polycrystalline silicon film pattern, the gate oxide film can maintain a uniform thickness without oxidizing the polycrystalline silicon film pattern or the gate oxide film when oxide films are to be formed on the drain and source regions. Accordingly, non-uniformity of the oxide film thickness in the end part of the gate oxide film and an increase in the film thickness caused by entering of so called "bird's beak" are prevented and thus fluctuations in characteristics during writing and erasing can be prevented.

(4) Since the side wall oxide film is provided in the side part of the polycrystalline silicon film and the source region and the drain regions are formed in different steps, the source region can be formed in a shallow manner from the end part of the floating gate electrode, and thus finer memory cells can be formed.

Although the preferred embodiment of the present invention has been described in detail, it should be noted understood that various changes, substitutions and alternations can be made therein without departing from spirit and scope of the inventions as defined by the appended claims.

What is claimed is:

1. A nonvolatile semiconductor memory device having memory cells comprising:
    a floating gate electrode provided on a surface of a semiconductor substrate through a gate oxide film;
    a control gate electrode provided on a surface of said floating gate electrode through a gate insulating film, the control gate electrode functioning also as a word line;
    a drain region provided on the surface of said semiconductor substrate and connected to a bit line composed of an N+ type diffusion layer orthogonally crossing said word line;
    a source region provided on the surface of said semiconductor substrate and connected to a source line composed of an N+ type diffusion layer orthogonally crossing said word line; and
    a side wall oxide film formed on a side face of said floating gate electrode and in an upper part of said drain and source regions,
    wherein said floating gate electrode has projecting and recessing parts in an upper surface thereof.

2. A nonvolatile semiconductor memory device according to claim 1, wherein said semiconductor substrate is a P type silicon substrate.

3. A nonvolatile semiconductor memory device according to claim 1, wherein said floating gate electrode is comprised of polysilicon.

4. A nonvolatile semiconductor memory device according to claim 1, wherein said control gate electrode is comprised of polysilicon.

* * * * *